United States Patent
Shibata et al.

(10) Patent No.: US 7,811,907 B2
(45) Date of Patent: Oct. 12, 2010

(54) METHOD FOR MANUFACTURING SEMICONDUCTOR DEVICE AND EPITAXIAL GROWTH EQUIPMENT

(75) Inventors: Takumi Shibata, Tajimi (JP); Shoichi Yamauchi, Nagoya (JP); Tomonori Yamaoka, Tokyo (JP); Syouji Nogami, Tokyo (JP)

(73) Assignees: DENSO CORPORATION, Kariya (JP); Sumco Corporation, Tokyo (JP)

( * ) Notice: Subject to any disclaimer, the term of this patent is extended or adjusted under 35 U.S.C. 154(b) by 355 days.

(21) Appl. No.: 11/528,678

(22) Filed: Sep. 28, 2006

(65) Prior Publication Data

US 2007/0072398 A1    Mar. 29, 2007

(30) Foreign Application Priority Data

Sep. 29, 2005  (JP) ............................... 2005-285694
Sep. 29, 2005  (JP) ............................... 2005-285700

(51) Int. Cl.
*H01L 29/78* (2006.01)
*H01L 29/12* (2006.01)
*H01L 21/336* (2006.01)
*H01L 21/205* (2006.01)

(52) U.S. Cl. ................. 438/481; 438/388; 438/245; 438/270; 438/478; 438/172; 438/424; 438/427; 257/E21.092; 257/E21.115

(58) Field of Classification Search ............... 438/478, 438/172, 424, 427, 388, 245, 270
See application file for complete search history.

(56) References Cited

U.S. PATENT DOCUMENTS 4,698,316 A * 10/1987 Corboy et al. ............. 117/102
5,166,767 A * 11/1992 Kapoor et al. ............. 257/518
6,097,063 A    8/2000 Fujihira
6,294,818 B1   9/2001 Fujihira
6,495,294 B1 * 12/2002 Yamauchi et al. .......... 438/597
6,498,368 B2  12/2002 Sakamoto et al.
6,555,891 B1 *  4/2003 Furukawa et al. .......... 257/505
6,566,709 B2   5/2003 Fujihira
6,627,948 B1   9/2003 Fujihira
6,700,157 B2   3/2004 Fujihira
6,720,615 B2   4/2004 Fujihira
6,724,040 B2   4/2004 Fujihira
6,734,496 B2   5/2004 Fujihira (Continued)

OTHER PUBLICATIONS

Silicon Processing for the VLSI Era, vol. 1—Process Technology. Wolf, S. And R. N. Tauber. California: Lattice Press. 2000. pp. 249-250.*

(Continued)

*Primary Examiner*—Zandra Smith
*Assistant Examiner*—Jeremy J Joy
(74) *Attorney, Agent, or Firm*—Posz Law Group, PLC

(57) ABSTRACT

A method for manufacturing a semiconductor device includes steps of: forming a trench on a main surface of a silicon substrate; forming a first epitaxial film on the main surface and in the trench; and forming a second epitaxial film on the first epitaxial film. The step of forming the first epitaxial film has a first process condition with a first growth rate of the first epitaxial film. The step of forming the second epitaxial film has a second process condition with a second growth rate of the second epitaxial film. The second growth rate is larger than the first growth rate.

20 Claims, 28 Drawing Sheets

U.S. PATENT DOCUMENTS

| | | | |
|---|---|---|---|
| 6,780,735 B2 * | 8/2004 | Jagannathan et al. | 438/510 |
| 6,836,001 B2 | 12/2004 | Yamauchi et al. | |
| 7,029,977 B2 | 4/2006 | Kishimoto et al. | |
| 7,063,751 B2 * | 6/2006 | Urakami et al. | 148/33.4 |
| 2001/0005031 A1 | 6/2001 | Sakamoto et al. | |
| 2002/0070418 A1 * | 6/2002 | Kinzer et al. | 257/496 |
| 2003/0047734 A1 | 3/2003 | Fu et al. | |
| 2004/0016959 A1 | 1/2004 | Yamaguchi et al. | |
| 2004/0185665 A1 | 9/2004 | Kishimoto et al. | |
| 2005/0035401 A1 | 2/2005 | Yamaguchi et al. | |
| 2005/0045996 A1 * | 3/2005 | Yamauchi et al. | 257/627 |
| 2005/0221547 A1 * | 10/2005 | Yamauchi et al. | 438/172 |
| 2006/0124997 A1 * | 6/2006 | Yamauchi et al. | 257/330 |
| 2007/0032092 A1 * | 2/2007 | Shibata et al. | 438/758 |
| 2007/0072397 A1 * | 3/2007 | Yamauchi et al. | 438/478 |

OTHER PUBLICATIONS

Wolf et al.—Silicon Processing for the VLSI Era, vol. 1—Process Technology. Wolf, S. and R. N. Tauber. California: Lattice Press. 2000. pp. 249-250.*

Notice of Preliminary Rejection dated Aug. 31, 2007 in corresponding Korean Application No. 10-2006-0095159 (and English translation).

Office Action dated Apr. 10, 2008 in corresponding German Patent Application No. 10 2006 045 912.1-43 (and English translation).

Office Action dated Apr. 11, 2008 in corresponding Chinese Patent Application No. 2006101403679 (and English translation).

Office Action dated Sep. 4, 2009 in corresponding Chinese Patent Application No. 200810129892X (and English translation).

Office Action dated Mar. 30, 2010 in corresponding German Patent Application No. 10 2006 062 821.7 (and English translation).

Office Action dated Apr. 1, 2010 in corresponding German Patent Application No. 10 2006 045 912.1 (and English translation).

* cited by examiner

Si (111)
40
41
Si (110) WAFER

41  Si (110)
Si (111)
40
Si (110)

50
Si (100)
51
Si (100) WAFER

51  Si (100)
Si (100)
50
Si (100)

METHOD FOR MANUFACTURING SEMICONDUCTOR DEVICE AND EPITAXIAL GROWTH EQUIPMENT

CROSS REFERENCE TO RELATED APPLICATIONS

This application is based on Japanese Patent Applications No. 2005-285694 filed on Sep. 29, 2005, and No. 2005-285700 filed on Sep. 29, 2005, the disclosures of which are incorporated herein by reference.

FIELD OF THE INVENTION

The present invention relates to a method for manufacturing a semiconductor device and epitaxial growth equipment.

BACKGROUND OF THE INVENTION

In comparison with a former MOS transistor, a MOS transistor (SJ-MOS transistor) of a super junction structure is known as an element for realizing low on-resistance (e.g., disclosed in JP-A-H09-266311). This SJ-MOS transistor is characterized in a repetitious pn column structure in a drift layer area. Plural methods are proposed to form this pn column. In these methods, a method for epitaxially growing the interior of a trench by LP-CVD after the trench is formed in a substrate is known as a method able to uniform a concentration distribution of a depth direction.

In trench filling using the general LP-CVD, a growth rate in an opening portion is large in comparison with a bottom portion. Therefore, a void is easily formed within the trench by blocking the opening portion. It is possible to restrain that the trench opening portion is previously blocked by simultaneously flowing a silane system gas and an etching gas (e.g., disclosed in JP-A-2004-273742).

However, a step difference caused by the trench is formed after a trench filling epitaxial process. Therefore, it is necessary to perform epitaxial growth for flattening and perform polishing.

Further, it is proposed that it is possible to prevent an opening portion of a trench from being earlier blocked by using a mixing growing system of an etching gas and a silane system gas with respect to the trench etched in a halide gas atmosphere in forming a p/n column structure by trench filling epitaxial growth.

Thus, the blocking of the trench opening portion can be restrained by an action of the etching gas, but a reduction of a growth rate is caused. Accordingly, a technique for improving the growth rate independently of the restraint of the blocking of the above trench opening portion is required.

SUMMARY OF THE INVENTION

In view of the above-described problem, it is an object of the present disclosure to provide a method for manufacturing a semiconductor device. It is another object of the present disclosure to provide epitaxial growth equipment.

According to a first aspect of the present disclosure, a method for manufacturing a semiconductor device includes steps of: forming a trench on a main surface of a silicon substrate; forming a first epitaxial film on the main surface of the silicon substrate and in the trench by using a mixed gas of a silicon source gas and a halide gas so that the trench is filled with the first epitaxial film; and forming a second epitaxial film on the first epitaxial film by using another process condition. The step of forming the first epitaxial film has a first process condition with a first growth rate of the first epitaxial film growing on the main surface of the silicon substrate. The step of forming the second epitaxial film has a second process condition with a second growth rate of the second epitaxial film growing on the main surface of the silicon substrate. The second growth rate of the second epitaxial film is larger than the first growth rate of the first epitaxial film.

In the above method, since the halide gas is used for forming the first epitaxial film, the first epitaxial film in the trench has no void substantially. Further, since the second growth rate of the second epitaxial film is larger than the first growth rate of the first epitaxial film, the throughput time, i.e., the manufacturing time of the device is improved. Accordingly, the surface of the device is simply flattened.

According to a second aspect of the present disclosure, a method for manufacturing a semiconductor device includes steps of: forming a trench on a main surface of a silicon substrate; and forming an epitaxial film in the trench by using a mixed gas of a silicon source gas and a halide gas so that the trench is filled with the epitaxial film. In the step of forming the epitaxial film, the epitaxial film is not formed on the main surface of the silicon substrate, and the step of forming the epitaxial film is completed when a top surface of the epitaxial film in the trench and the main surface of the silicon substrate are on a same plane.

In the above method, since the halide gas is used for forming the epitaxial film, the epitaxial film in the trench has no void substantially. Further, the surface of the device is simply flattened.

According to a third aspect of the present disclosure, a method for manufacturing a semiconductor device include steps of: forming a mask for a trench on a main surface of a silicon substrate; forming the trench on the main surface of the silicon substrate by etching the main surface of the silicon substrate through an opening of the mask; forming an epitaxial film in the trench of the silicon substrate with the mask by using a mixed gas of a silicon source gas and a halide gas so that the trench is filled with the epitaxial film; and removing the mask after the step of forming the epitaxial film. In the step of forming the epitaxial film, the epitaxial film is not formed on the mask, and the step of forming the epitaxial film is completed when a top surface of the epitaxial film in the trench and the main surface of the silicon substrate are on a same plane.

In the above method, since the halide gas is used for forming the epitaxial film, the epitaxial film in the trench has no void substantially. Further, the surface of the device is simply flattened.

According to a fourth aspect of the present disclosure, a method for manufacturing a semiconductor device includes steps of: forming a mask for a trench on a main surface of a silicon substrate; forming the trench on the main surface of the silicon substrate by etching the main surface of the silicon substrate through an opening of the mask; forming an epitaxial film in the trench of the silicon substrate with the mask by using a mixed gas of a silicon source gas and a halide gas so that the trench is filled with the epitaxial film, wherein the epitaxial film is not formed on the mask, and the step of forming the epitaxial film is completed when a top surface of the epitaxial film in the trench is higher than the main surface of the silicon substrate; polishing a surface of the epitaxial film on a main surface side of the silicon substrate by using the mask as a stopper of polishing so that the main surface side of the silicon substrate is flattened; and removing the mask after the step of polishing the surface of the epitaxial film.

In the above method, since the halide gas is used for forming the epitaxial film, the epitaxial film in the trench has no void substantially. Further, the surface of the device is simply flattened.

According to a fifth aspect of the present disclosure, a method for manufacturing a semiconductor device includes steps of: forming a mask for a trench on a main surface of a silicon substrate; forming the trench on the main surface of the silicon substrate by etching the main surface of the silicon substrate through an opening of the mask; forming an epitaxial film on the mask and in the trench by using a mixed gas of a silicon source gas and a halide gas so that the trench is filled with the epitaxial film; polishing a surface of the epitaxial film on a main surface side of the silicon substrate by using the mask as a stopper of polishing so that the main surface side of the silicon substrate is flattened; and removing the mask after the step of polishing the surface of the epitaxial film.

In the above method, since the halide gas is used for forming the epitaxial film, the epitaxial film in the trench has no void substantially. Further, the surface of the device is simply flattened.

According to a sixth aspect of the present disclosure, epitaxial growth equipment includes: a chamber; a chuck disposed in the chamber and fixing a silicon substrate, wherein the silicon substrate has a main surface, on which a trench is disposed; a first gas flow controller for controlling a gas flow rate of a silicon source gas, wherein the silicon source gas is to be introduced into the chamber in order to form an epitaxial film on the silicon substrate; a second gas flow controller for controlling a gas flow rate of a halide source gas, wherein the halide gas is to be introduced into the chamber; a temperature controller for controlling a process temperature in the chamber; a pressure controller for controlling a process pressure in the chamber; a pyrometer for monitoring a surface temperature of the epitaxial film on the silicon substrate in the chamber; a main controller for controlling at least one of the first gas flow controller, the second gas flow controller, the temperature controller and the pressure controller based on an output signal of the pyrometer. The main controller switches at least one of the gas flow rate of the silicon source gas, the gas flow rate of the halide source gas, the process temperature and the process pressure in order to increase a growth rate of the epitaxial film when the output signal of the pyrometer at a predetermined monitoring surface temperature becomes substantially constant.

By using the above equipment, the epitaxial film is formed in the trench with no void substantially. Further, the surface of the device is simply flattened.

According to a seventh aspect of the present disclosure, a method for manufacturing a semiconductor device includes steps of: forming a first epitaxial film having a first conductive type on a silicon substrate having the first conductive type; forming a plurality of trenches in the first epitaxial film, wherein the first epitaxial film between adjacent two trenches has a width, which is larger than a width of the trench; forming a second epitaxial film having a second conductive type on the first epitaxial film and in the trench so that the trench is filled with the second epitaxial film, wherein the second epitaxial film has an impurity concentration higher than that of the first epitaxial film. The step of forming the second epitaxial film includes a final step, in which a mixed gas of a silicon source gas and a halide gas is used for forming the second epitaxial film.

In the above method, the trench opening is not covered with the second epitaxial film before the trench is filled with the second epitaxial film. Further, since the first epitaxial film between adjacent two trenches has a width larger than a width of the trench, the growth rate of the second epitaxial film is increased.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment Mode

A first embodiment mode for embodying the invention will next be explained in accordance with the drawings.

Figure 1:
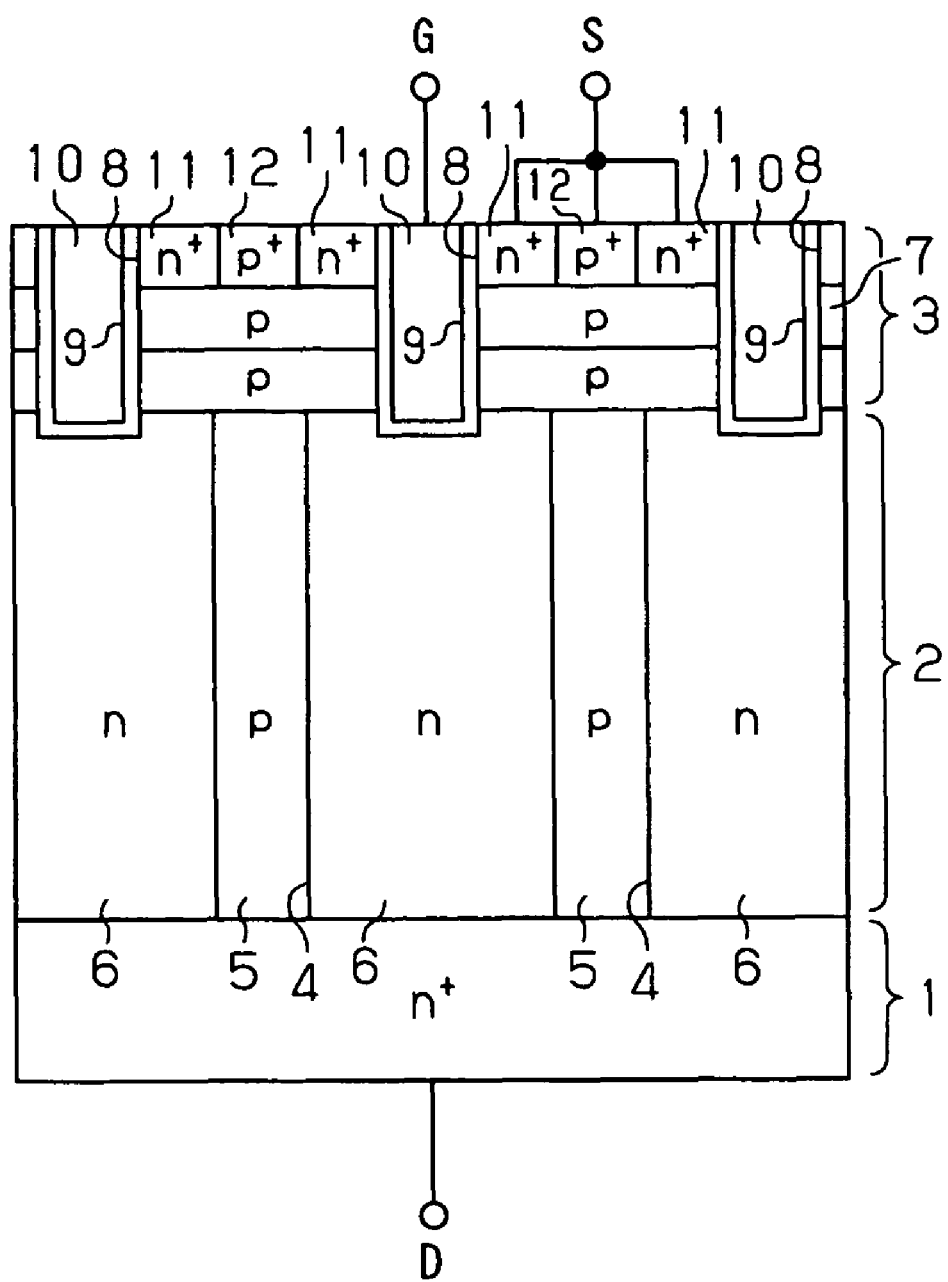
FIG. 1 is a cross sectional view showing a vertical type trench gate MOSFET.

FIG. 1 shows a cross-sectional view of a longitudinal type trench gate MOSFET in this embodiment mode.

In FIG. 1, an epitaxial film 2 is formed on an n$^+$ silicon substrate 1 as a drain area, and an epitaxial film 3 is formed on this epitaxial film 2. A trench 4 is arranged in parallel in the epitaxial film 2 of the lower side. The trench 4 passes through the epitaxial film 2 and reaches the n$^+$ silicon substrate 1. An epitaxial film 5 is filled within the trench 4. An electric conductivity type of the epitaxial film 5 within the trench 4 is a p type and the electric conductivity type of a transversal area 6 of the trench 4 is an n type. Thus, the p type area 5 and the n type area 6 are alternately arranged in the transversal direction. Thus, a so-called super junction structure in which a drift layer of MOSFET has a p/n column structure is formed.

In the above epitaxial film 3 of the upper side, a p layer 7 is formed in its surface layer portion. A trench 8 for a gate is arranged in parallel in the epitaxial film 3, and reaches the epitaxial film 2. A gate oxide film 9 is formed on an inner face of the trench 8. A polysilicon gate electrode 10 is arranged in an inner direction of the gate oxide film 9. An n$^+$ source area 11 is formed in a surface layer portion in a part abutting on the trench 8 on an upper face of the epitaxial film 3. Further, a p$^+$ source contact area 12 is formed in a surface layer portion on the upper face of the p type epitaxial film 3.

An unillustrated drain electrode is formed on a lower face of the n$^+$ silicon substrate 1, and is electrically connected to the n$^+$ silicon substrate 1. Further, an unillustrated source electrode is formed on the upper face of the epitaxial film 3, and is electrically connected to the n$^+$ source area 11 and the p$^+$ source contact area 12.

The transistor is turned on by applying a predetermined positive voltage as a gate electric potential in a state in which a source voltage is set to a ground electric potential and a drain voltage is set to a positive electric potential. When the transistor is turned on, an inversion layer is formed in a part abutting on the gate oxide film 9 in the p layer 7. Electrons are flowed through this inversion layer between the source and the drain (from the n$^+$ source area 11, the p layer 7, the n type area 6, to the n$^+$ silicon substrate 1). At a reverse bias applying time (in a state in which the source voltage is set to the ground electric potential and the drain voltage is set to the positive electric potential), a depletion layer is spread from a pn junction portion of the p type area 5 and the n type area 6. The p type area 5 and the n type area 6 are depleted and high breakdown voltage is obtained.

Next, a manufacturing method of the longitudinal type trench gate MOSFET in this embodiment mode will be explained by using FIGS. 2A to 2C and 3A to 3C.

Figure 4:
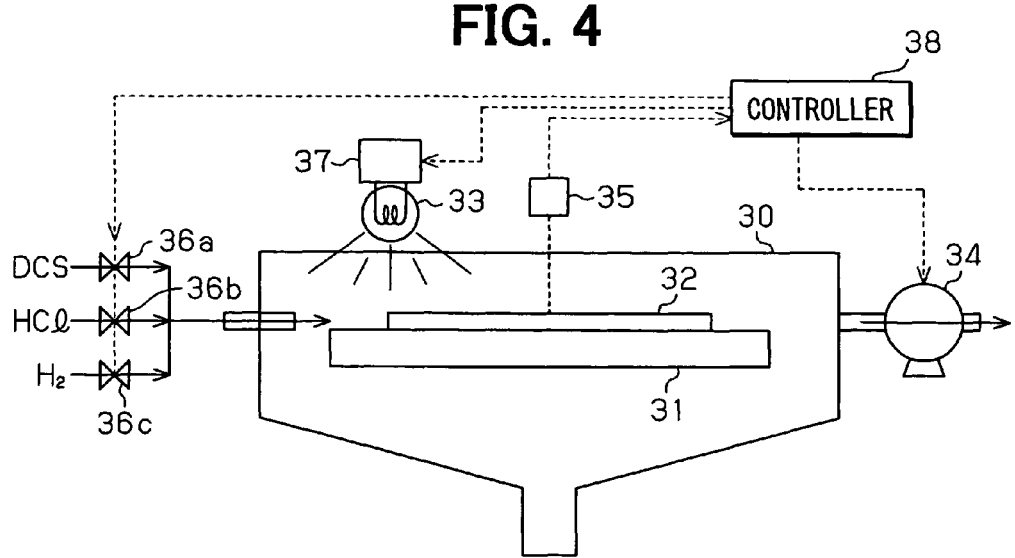
FIG. 4 is a schematic view showing epitaxial growth equipment.

First, the epitaxial growing device used in this manufacturing process will be explained. FIG. 4 is a schematic constructional view of the epitaxial growing device.

In FIG. 4, a base 31 for chucking a substrate (wafer) 32 is arranged within a chamber 30. In the substrate (wafer) 32, a trench is formed on a main surface. The silicon substrate (wafer) 32 can be heated by a lamp 33. An exhaust pump 34 is connected to the chamber 30. A silicon source gas such as SiH$_2$Cl$_2$ (dichlorosilane: DCS), etc., a halide gas such as hydrogen chloride gas (HCl), etc. and hydrogen gas can be introduced into the chamber 30. Further, a thermometer 35 is arranged, and the surface of an epitaxial film at an epitaxial growing time can be observed by this thermometer 35. Namely, surface temperature at an epitaxial film forming time in the silicon substrate 32 fixed to the chuck base 31 within the chamber 30 can be monitored. The flow rate of the silicon source gas supplied into the chamber 30 for the epitaxial growth can be adjusted by a valve 36a as a first gas flow rate adjusting means. The flow rate of the halide gas supplied into the chamber 30 at the epitaxial growing time can be adjusted by a valve 36b as a second gas flow rate adjusting means. The flow rate of the hydrogen gas can be adjusted by a valve 36c. Growth temperature within the chamber 30 can be adjusted through the lamp 33 by a temperature controller 37 as a temperature adjusting means. Growth pressure within the chamber 30 can be adjusted by a pump 34 as a growth pressure adjusting means. The thermometer 35, the valves 36a, 36b, 36c, the temperature controller 37 and the exhaust pump 34 are connected to a controller 38 as a switching means. A signal from the thermometer 35 is inputted to the controller 38, and the controller 38 controls the operations of the valves 36a, 36b, 36c, the temperature controller 37 and the exhaust pump 34.

Figure 6:
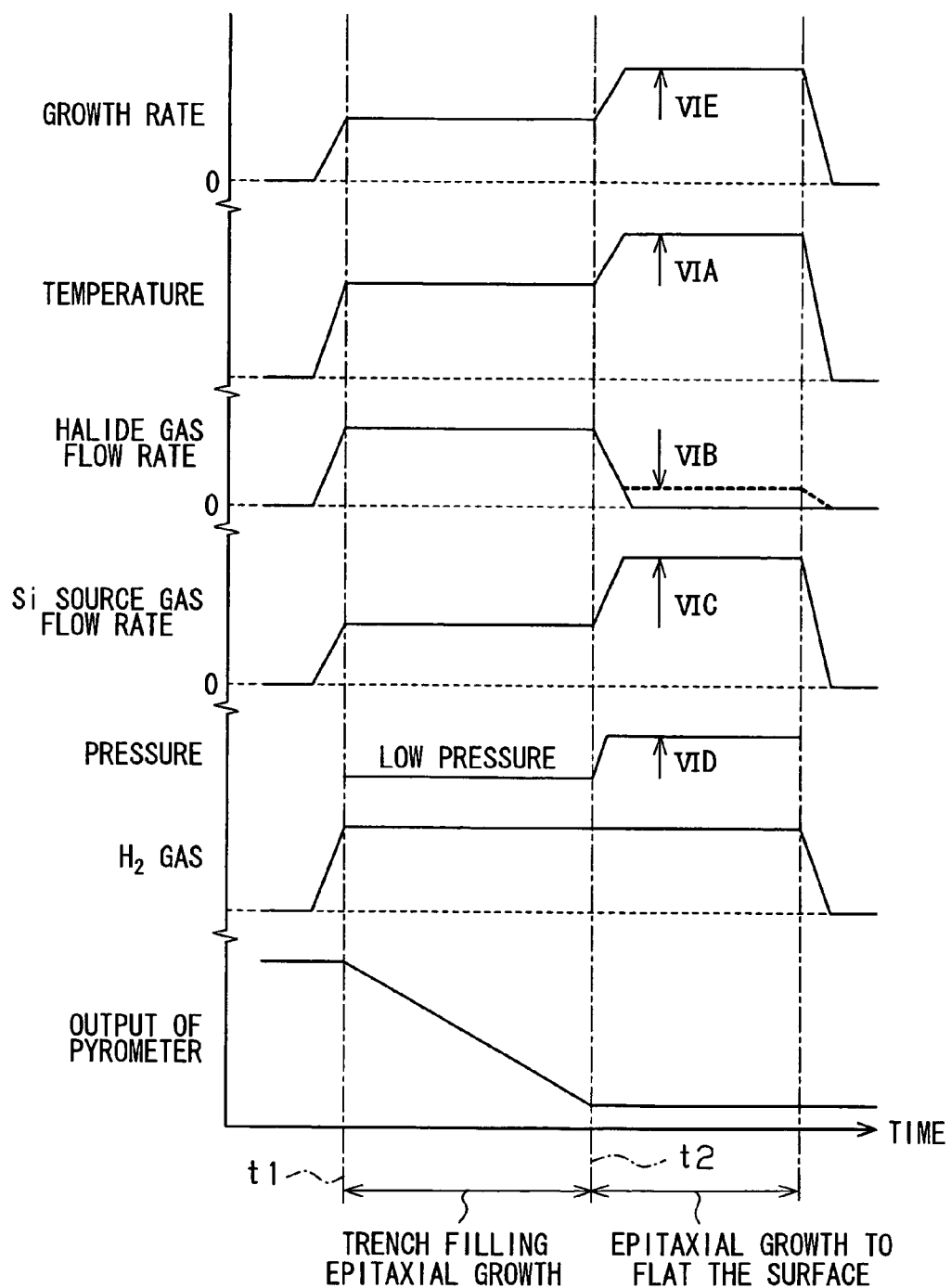
FIG. 6 is a timing chart showing a manufacturing process of the MOSFET.

FIG. 6 shows a time chart when the epitaxial growth is performed by using the epitaxial growing device of FIG. 4. FIG. 6 shows changes of a growth rate (speed on a main surface of the silicon substrate) in an epitaxial growing process, the growth temperature, the halide gas flow rate, the silicon source gas flow rate, the growth pressure, the hydrogen gas flow rate and an output of the thermometer.

Figure 2A:
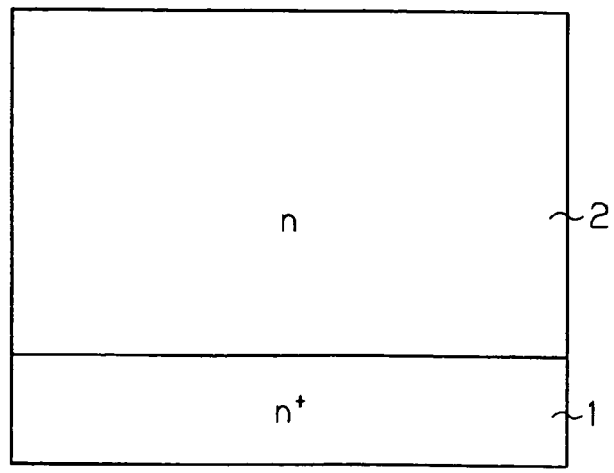
FIG. 2A to 2C are cross sectional views explaining a method for manufacturing the MOSFET shown in FIG. 1.

First, as shown in FIG. 2A, an n$^+$ silicon substrate 1 is prepared and an epitaxial film 2 of the n type is formed on this n$^+$ silicon substrate 1. Further, the upper face of the epitaxial film 2 is flattened.

Figure 2B:
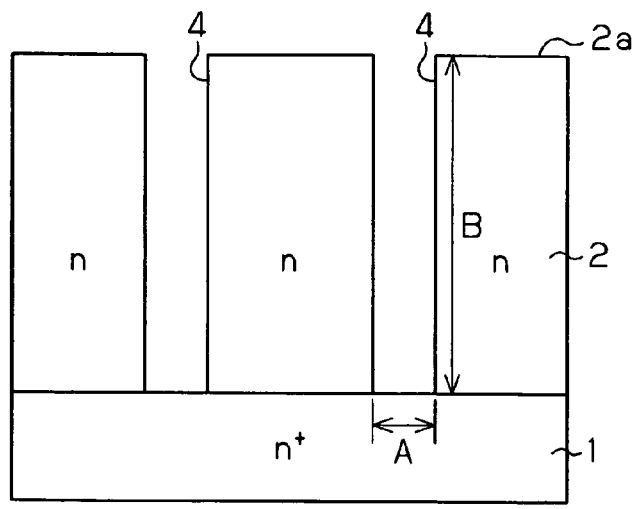

Subsequently, as shown in FIG. 2B, anisotropic etching (RIE), or wet etching using an alkaline anisotropic etching liquid (KOH, TMAH, etc) is performed by using a mask with respect to the epitaxial film 2 of the n type, and a trench 4 reaching the silicon substrate 1 is formed. Thus, the trench 4 is formed on a main surface 2a of the silicon substrate constructed by the n$^+$ silicon substrate 1 and the epitaxial film 2. For example, the trench 4 approximately has 0.8 μm in width and 13 μm in depth.

Figure 7A:
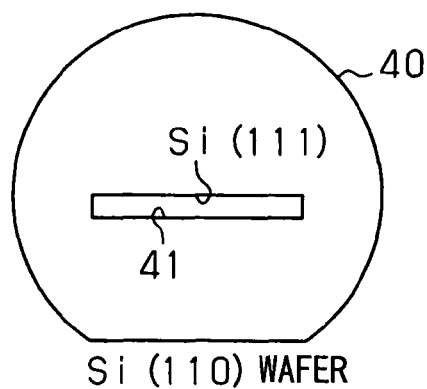
FIG. 7A is a plan view showing a wafer.
Figure 7B:
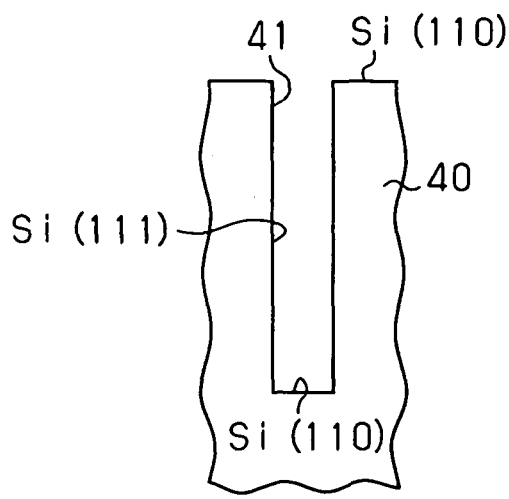
FIG. 7B is a cross sectional view showing the wafer shown in FIG. 7A.

Here, the used substrate will be referred. As shown in FIGS. 7A and 7B, a Si (110) substrate is used as a monocrystal substrate, and a structure having an epitaxial film 40 formed on this Si (110) substrate is used. Thus, a trench bottom face is a (110)-plane, and a (111)-plane is included on a side face of the trench 41. A filling shape becomes most excellent in trench filling epitaxy using LP-CVD by using this orientation, and trench filling epitaxial growth without void can be performed and throughput can be improved. Further, Si (110) substrate and the (111)-oriented trench are set in this way, wet processing of TMAH, KOH, etc. can be applied with respect to the trench. Therefore, damage of the trench face can be reduced with respect to a case using dry etching.

Figure 8A:
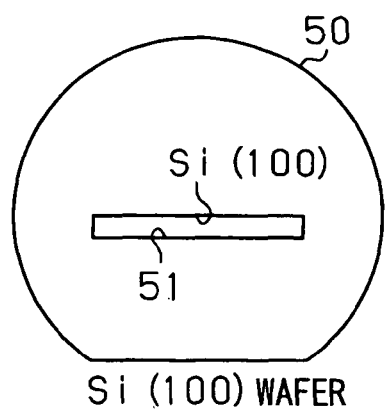
FIG. 8A is a plan view showing another wafer.
Figure 8B:
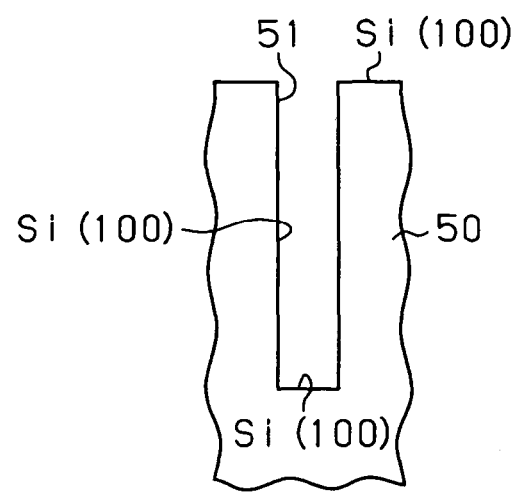
FIG. 8B is a cross sectional view showing the wafer shown in FIG. 8A.

Otherwise, as shown in FIGS. 8A and 8B, a Si (100) substrate is used as the monocrystal substrate, and a structure having an epitaxial film 50 formed on this Si (100) substrate is used. Thus, the trench bottom face is a (100)-plane, and the (100)-plane is included on a side face of the trench 51. The (100)-oriented trench most excellent in characteristics of a device is Si (100), and all the orientations become Si (100) by setting the orientation of the trench side face of the p/n column to Si (100). Thus, a dependent property of the orientation is removed within the trench in performing the trench filling epitaxial growth.

Figure 2C:
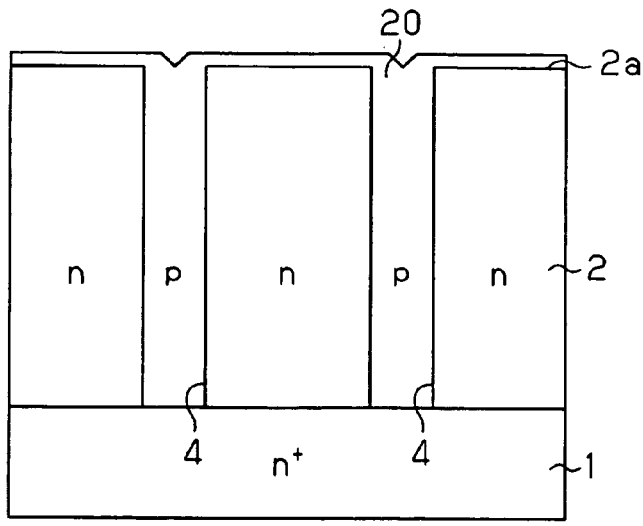
Figure 9:
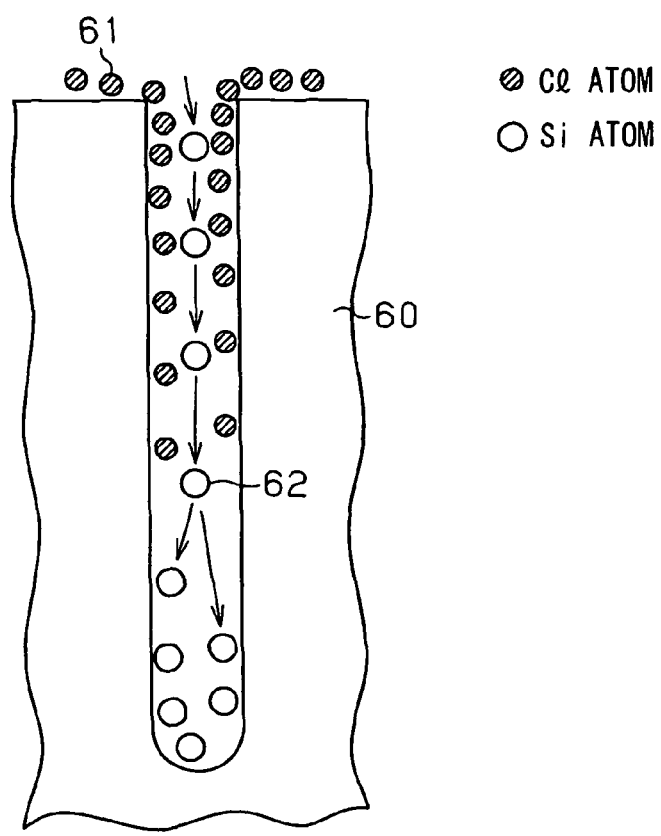
FIG. 9 is a cross sectional view explaining movement of an atom in epitaxial growth process.

As shown in FIG. 2C, an epitaxial film 20 is then formed on the epitaxial film 2 (on a main surface 2a) including the interior of the trench 4, and the interior of the trench 4 is filled by this epitaxial film 20. At this time, in FIG. 6, the growth is started in timing of t1. Concretely, temperature within the chamber is raised and a required amount of the halide gas is flowed, and a required amount of the silicon source gas is flowed. Further, a pressure reduction environment is set as film forming pressure within the chamber, and hydrogen gas is flowed. For example, $SiH_2Cl_2$ (dichlorosilane: DCS) is used as the silicon source gas, and gas mixed with hydrogen chloride (HCl) is used as the halide gas, and the interior of the trench 4 is filled by low pressure epitaxial growth. In this case, as shown in FIG. 9, a chlorine atom (Cl atom) 61 is attached to a silicon surface in a trench opening portion as a behavior of an element (chlorine atom 61 and silicon atom 62) with respect to the trench formed in an epitaxial film 60. Therefore, silicon is grown from a trench bottom portion.

In FIG. 6, the growth temperature is 960° C., and the growth pressure is set to 40 Torr, and the flow rate of DCS is 0.1 slm, and the flow rate of hydrogen gas ($H_2$) is 30 slm, and the flow rate of hydrogen chloride gas (HCl) is 0.5 slm as a typical growing condition of the trench filling epitaxy. The growth rate on the trench surface (substrate main surface) in this condition is about several ten to 100 nm/min.

In a process for filling the interior of this trench 4 by the epitaxial film 20, the mixing gas of the silicon source gas and the halide gas is used as gas supplied to the silicon substrate so as to form the epitaxial film 20. Concretely, one of monosilane ($SiH_4$), disilane ($Si_2H_6$), dichlorosilane ($SiH_2Cl_2$), trichlorosilane ($SiHCl_3$) and silicon tetrachloride ($SiCl_4$) is used as the silicon source gas. In particular, one of monosilane, disilane, dichlorosilane and trichlorosilane is preferably used as the silicon source gas. One of hydrogen chloride (HCl), chlorine ($Cl_2$), fluorine ($F_2$), chlorine trifluoride ($ClF_3$), hydrogen fluoride (HF) and hydrogen bromide (HBr) is used as the halide gas.

On the other hand, when the epitaxial film 20 in FIG. 2C is formed (when the epitaxial growth is performed), the following contents are set in accordance with an aspect ratio of the trench.

When the aspect ratio of the trench is less than 10 and a standard flow rate of the halide gas is set to X [slm] and the growth rate is Y [μm/minute], the following relationship is satisfied.

$$Y<0.2X+0.1 \quad (F1)$$

When the aspect ratio of the trench is 10 or more and is less than 20 and the standard flow rate of the halide gas is set to X [slm] and the growth rate is Y [μm/minute], the following relationship is satisfied.

$$Y<0.2X+0.05 \quad (F2)$$

When the aspect ratio of the trench is 20 or more and the standard flow rate of the halide gas is set to X [slm] and the growth rate is Y [μm/minute], the following relationship is satisfied.

$$Y<0.2X \quad (F3)$$

Thus, it is preferable from the viewpoint that the trench is efficiently filled by the epitaxial film while generation of a void is restrained.

Figure 10:
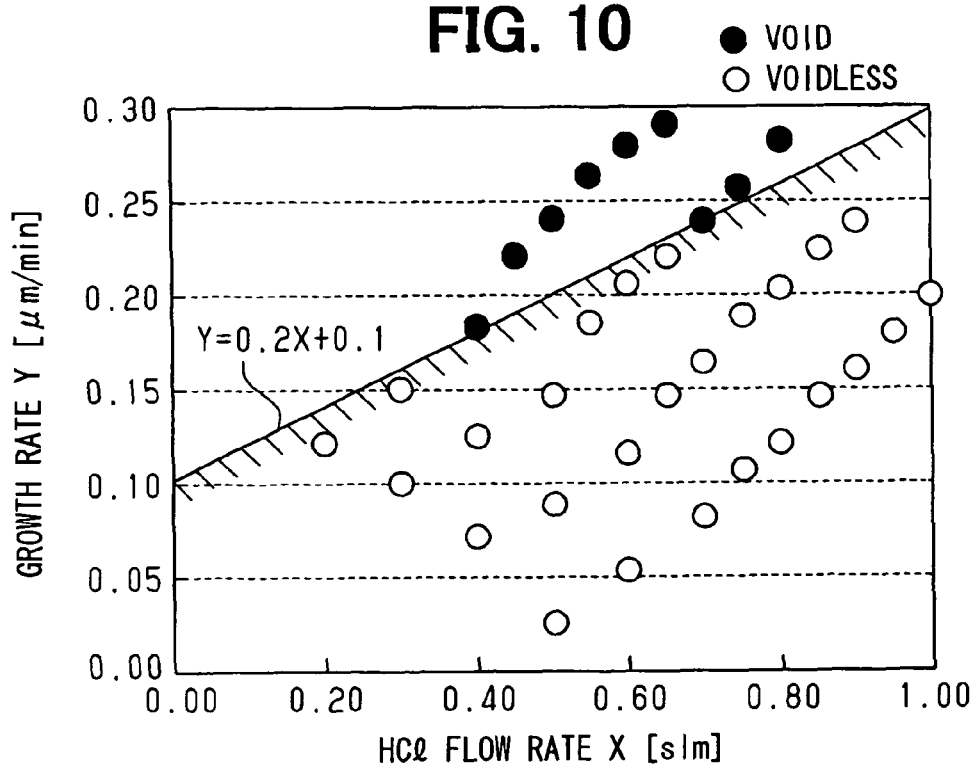
FIG. 10 is a graph showing existence or non-existence of a void in an epitaxial film in view of a relationship between a standard flow rate of HCl and a growth rate of the epitaxial film in case of an aspect ratio of 5.
Figure 11:
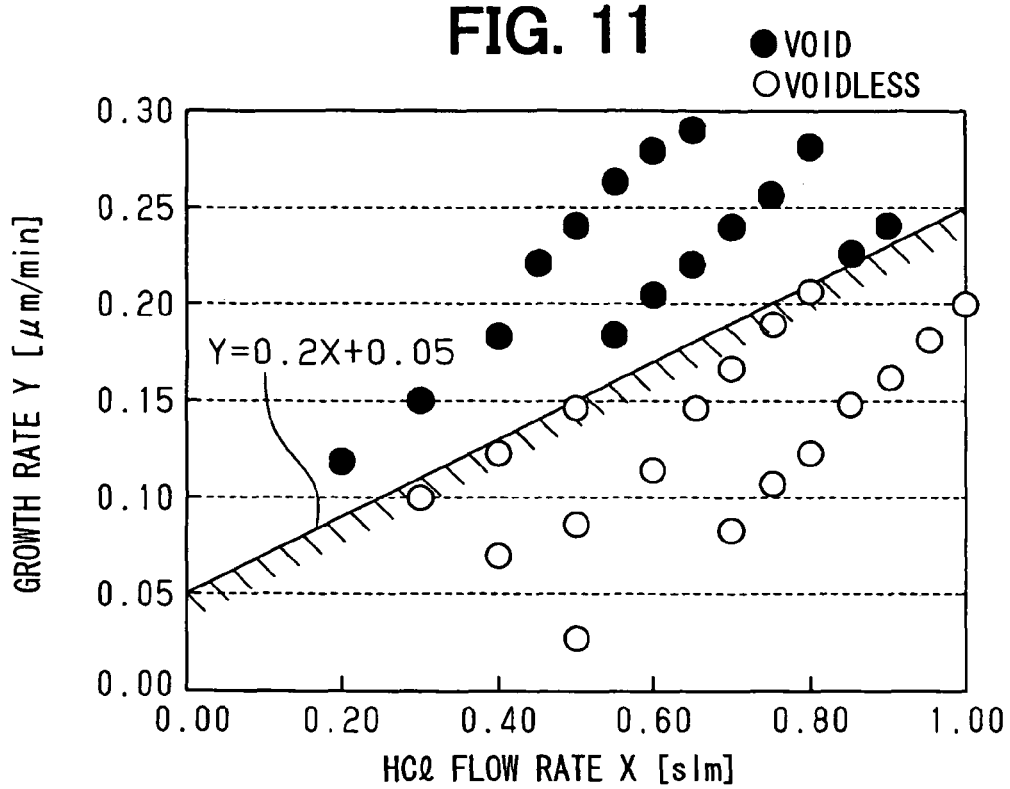
FIG. 11 is a graph showing existence or non-existence of a void in an epitaxial film in view of a relationship between a standard flow rate of HCl and a growth rate of the epitaxial film in case of an aspect ratio of 15.
Figure 12:
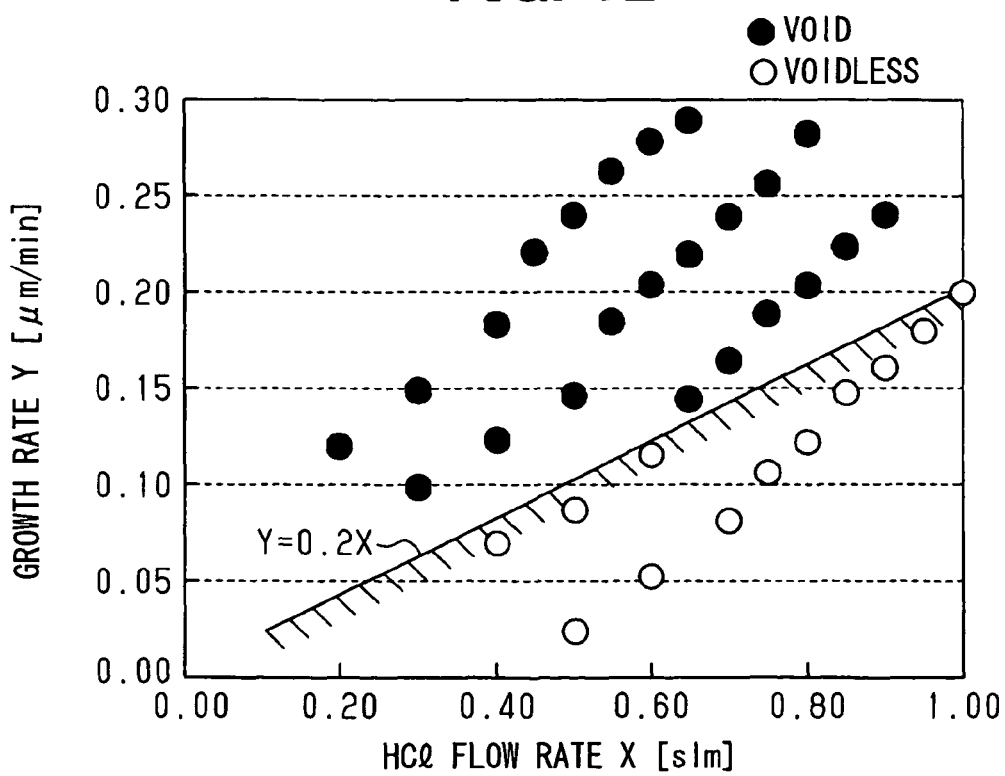
FIG. 12 is a graph showing existence or non-existence of a void in an epitaxial film in view of a relationship between a standard flow rate of HCl and a growth rate of the epitaxial film in case of an aspect ratio of 25.

Experimental results as its basis are shown in FIGS. 10, 11 and 12. In FIGS. 10, 11 and 12, the standard flow rate X [slm] of hydrogen chloride is set on the axis of abscissa, and the growth rate Y [μm/minute] is set on the axis of ordinate. FIG. 10 shows a case in which the aspect ratio is "5". FIG. 11 shows a case in which the aspect ratio is "15". FIG. 12 shows a case in which the aspect ratio is "25". In FIGS. 10, 11 and 12, a black circle shows that there is a void, and a white circle shows that there is no void. In each of these figures, it is known that no void is generated even when the growth rate of the epitaxial film is fast if the standard flow rate of hydrogen chloride is increased. Further, it is also known that no generation of the void can be prevented if no growth rate of the epitaxial film is reduced as the aspect ratio is increased if it is the same standard flow rate of hydrogen chloride. In each of these figures, a formula showing the boundary of the existence of the generation of the void is Y=0.2X+0.1 in FIG. 10 and is Y=0.2X+0.05 in FIG. 11 and is Y=0.2X in FIG. 12. No void is generated if it is an area below each formula. As shown in FIG. 2B, the aspect ratio of the trench is B/A, i.e., the depth of the trench/the width of the trench.

Further, the epitaxial film 20 is formed under a reaction rate determining condition. In particular, an upper limit of film forming temperature is set to 950° C. when monosilane or disilane is used as the silicon source gas. The upper limit of the film forming temperature is set to 1100° C. when dichlorosilane is used as the silicon source gas. The upper limit of the film forming temperature is set to 1150° C. when trichlorosilane is used as the silicon source gas. The upper limit of the film forming temperature is set to 1200° C. when silicon tetrachloride is used as the silicon source gas. Thus, it is experimentally confirmed that the epitaxial growth can be performed without generating a crystal defect.

Figure 3A:
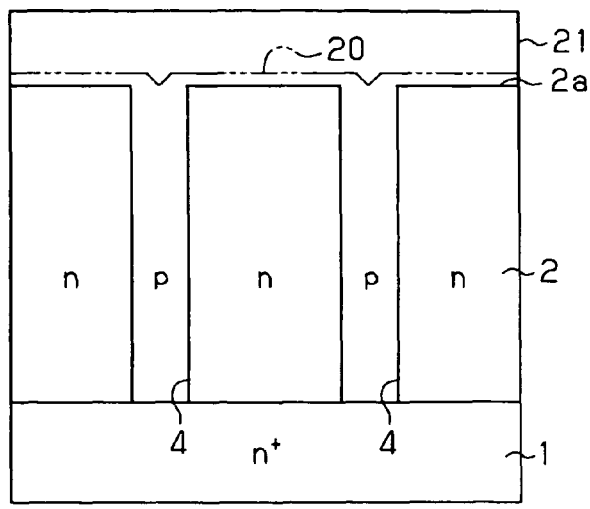
FIG. 3A to 3C are cross sectional views explaining the method for manufacturing the MOSFET shown in FIG. 1.

When the filling of the epitaxial film 20 within the trench 4 is thus completed, as shown in FIG. 3A, an epitaxial film 21 is subsequently formed on the epitaxial film 20 by performing the epitaxial growth for flattening. Namely, when the filling epitaxial growth is performed from the trench bottom portion by using the silicon source gas and the halide gas, a step difference caused by the trench is formed. In consideration of a polishing process, it is desirable to flatten the substrate main surface so as to reduce a polishing amount, and the epitaxial growth is performed for flattening after the trench filling epitaxy. In this flattening epitaxy, film formation is performed under the growth of a growth rate faster than the growth rate of the epitaxial film 20 on the substrate main surface 2a in the trench filling epitaxy. Concretely, in FIG. 6, the film forming condition of at least one of (VIA) to (VIAD) is changed.

(VIA) The growth temperature is raised in comparison with that at the filling epitaxial growing time.

(VIB) No halide gas is flowed, or the flow rate of the halide gas is reduced in comparison with that at the filling epitaxial growing time.

(VIC) The flow rate of the silicon source gas is increased in comparison with that at the filling epitaxial growing time.

(VID) The growth pressure is raised in comparison with that at the filling epitaxial growing time.

Thus, as shown in (VIE) of FIG. 6, it can be set under a condition in which the growth rate of silicon on the main surface (plane) 2a of the silicon substrates 1, 2, is fast in flattening epitaxy.

Here, the film formation is performed under the condition faster than the growth rate of the epitaxial film 20 on the main surface 2a of the silicon substrates 1, 2, in a flattening epitaxial process. Therefore, when it is switched to the flattening epitaxial growth after the filling epitaxial growth is terminated, at least two or more of the respective parameters of the flow rate of the halide gas, the flow rate of the silicon source gas, the growth temperature and the growth pressure may be also simultaneously switched so as to attain a high growth rate condition.

Further, completion of the trench filling is detected as follows.

When an output of the thermometer is monitored and the trench is filled during the epitaxial growth, no output value of the thermometer is changed as shown in timing of t2 of FIG. 6. The controller 38 of FIG. 4 detects the trench filling completion in this timing t2, and performs switching to a condition for increasing the growth rate. Namely, at a time point at which the surface temperature of the epitaxial film filled in the trench is monitored in the thermometer 35 from the main surface side of the silicon substrate 32 and no output signal level of the thermometer 35 at a predetermined measuring temperature is changed, the controller 38 as a switching means controls at least one of the flow rate of the silicon source gas, the flow rate of the halide gas, the growth temperature and the growth pressure by at least one of the valve 36a (first gas flow rate adjusting means), the valve 36b (second gas flow rate adjusting means), the temperature controller 37 (temperature adjusting means) and the pump 34 (growth pressure adjusting means), and performs the switching to the condition for increasing the growth rate.

Figure 5:
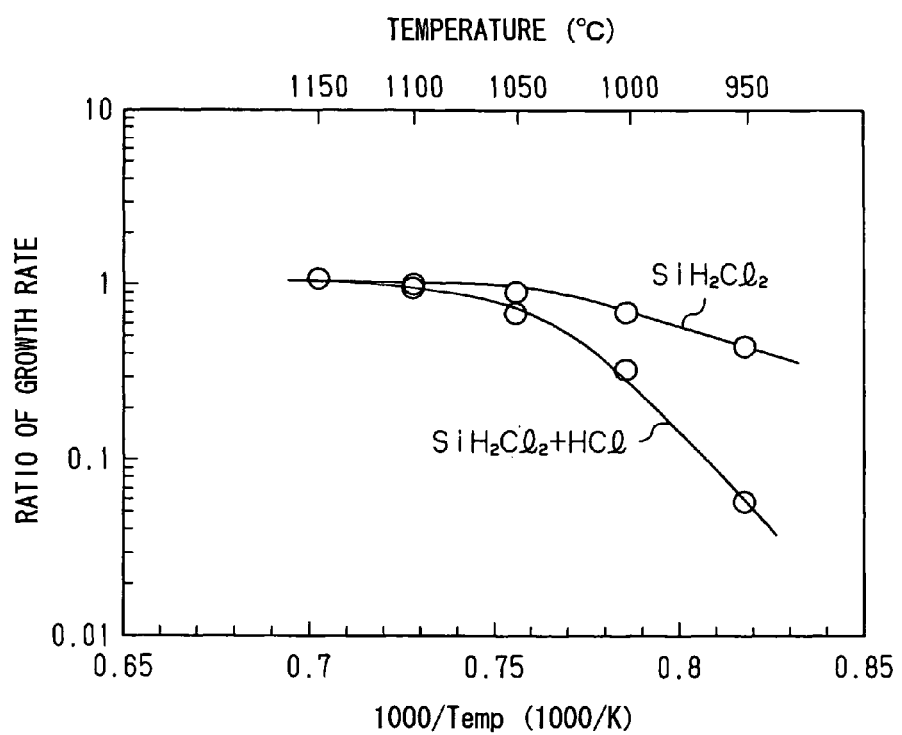
FIG. 5 is a graph showing a relationship between a process temperature and a ratio of growth rate.

FIG. 5 shows a measuring result relating to the epitaxial growth rate. In FIG. 5, temperature is set on the axis of abscissa, and a growth rate ratio is set on the axis of ordinate. FIG. 5 shows a case of only dichlorosilane, and a case grown by using a mixing gas of dichlorosilane and hydrogen chloride. It is understood from this FIG. 5 that the growth rate in the case grown by using only dichlorosilane is faster than the case grown by using the mixing gas of dichlorosilane and hydrogen chloride. Further, it is understood that the growth can be hastened in the case of higher temperature.

In the flattening epitaxy, a typical growth rate is several μm/min when the growth temperature is changed from 960° C. to 990° C. and the pressure in the chamber is changed from 40 Torr to 80 Torr. Accordingly, when the thickness of the epitaxial film for flattening is set to 3 μm, it takes 30 minutes (=3 [μm]/0.1 [μm/min]) when epitaxy (mixing epitaxy using HCl) similar to that of the trench filling condition attaining the above growth rate of several ten to 100 nm/min is used. However, this time can be shortened to three minutes (=3 [μm]/1 [μm/min]). Therefore, throughput of the epitaxial process can be improved.

Figure 3B:
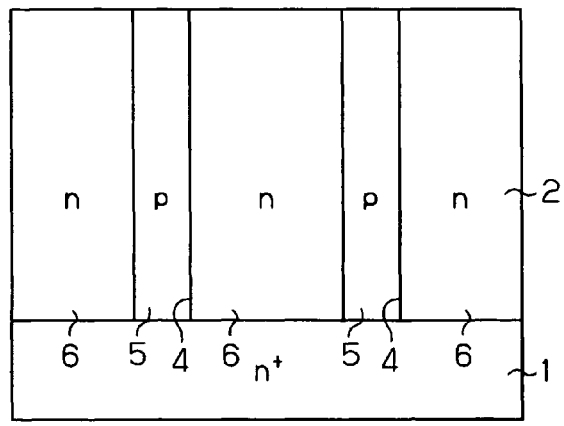

When the flattening epitaxial growth is terminated, flattening polishing is performed from the upper face side of the epitaxial film 21 in FIG. 3A. Namely, the epitaxial films 21, 20, of the substrate main surface 2a side are polished. As shown in FIG. 3B, the epitaxial film (n type silicon layer) 2 is exposed by this polishing. Thus, the p type area 5 and the n type area 6 are alternately arranged in the transversal direction. The polishing may be performed in accordance with necessity.

Figure 3C:
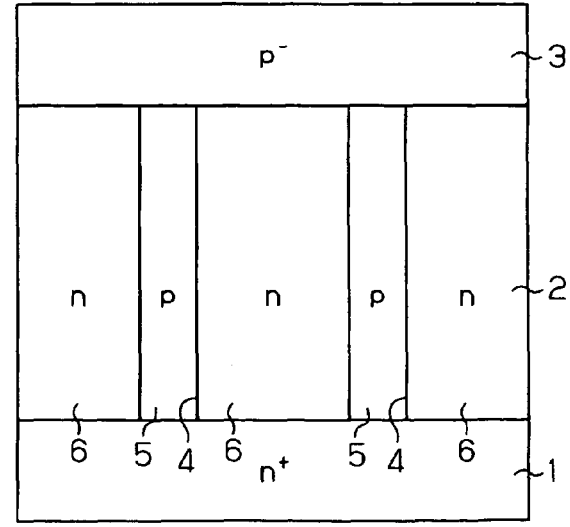

As shown in FIG. 3C, a p⁻ type epitaxial film 3 is then formed on the epitaxial film 2. Further, as shown in FIG. 1, a p well layer 7, a trench 8, a gate oxide film 9, a polysilicon gate electrode 10, an n⁺ source area 11 and a p⁺ source contact area 12 are formed. Further, electrodes and wiring are formed.

Next, in such a manufacturing process, the epitaxial film forming process shown in FIGS. 2C and 3A will be explained in detail.

FIGS. 24A to 24F show manufacturing process views for comparison substituted for FIGS. 2A to 2C and 3A to 3C. FIG. 25 is a time chart for comparison substituted for FIG. 6.

Figure 24A:
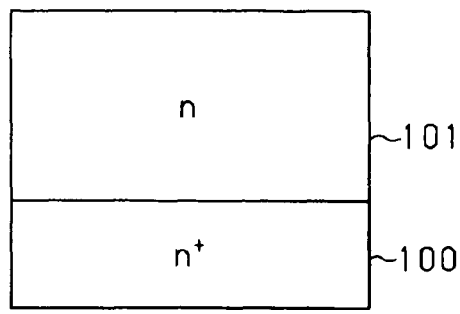
FIG. 24A to 24F are cross sectional views explaining a method for manufacturing the MOSFET as a comparison.
Figure 24D:
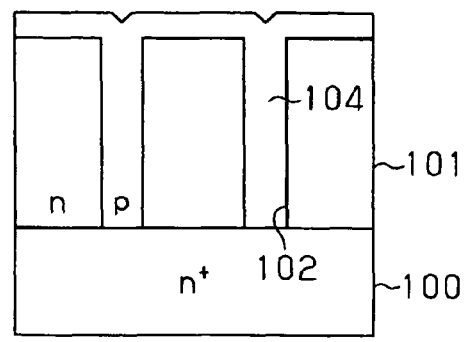
Figure 24B:
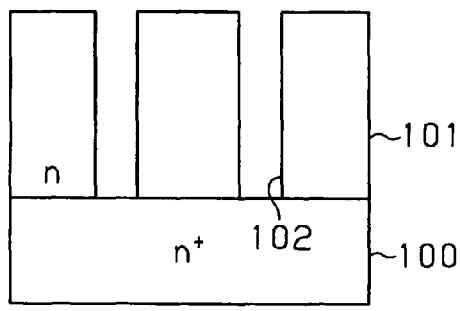
Figure 24E:
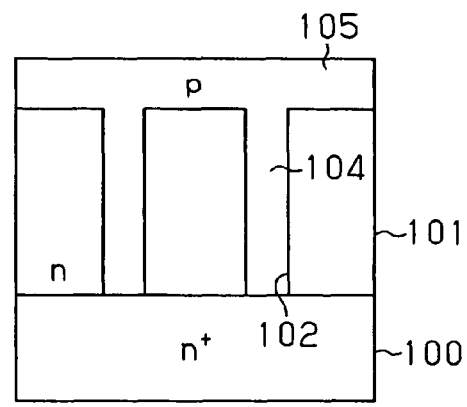
Figure 24C:
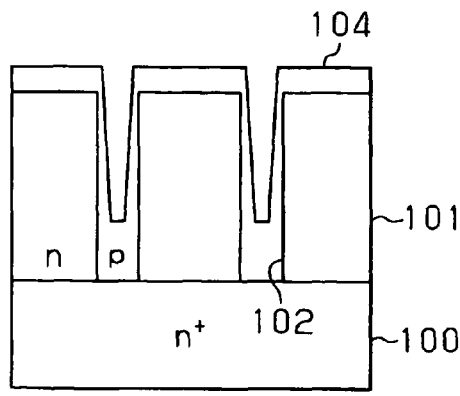
Figure 24F:
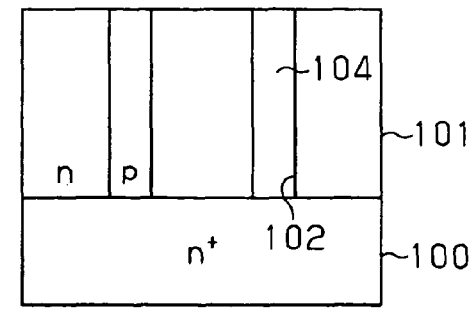
Figure 25:
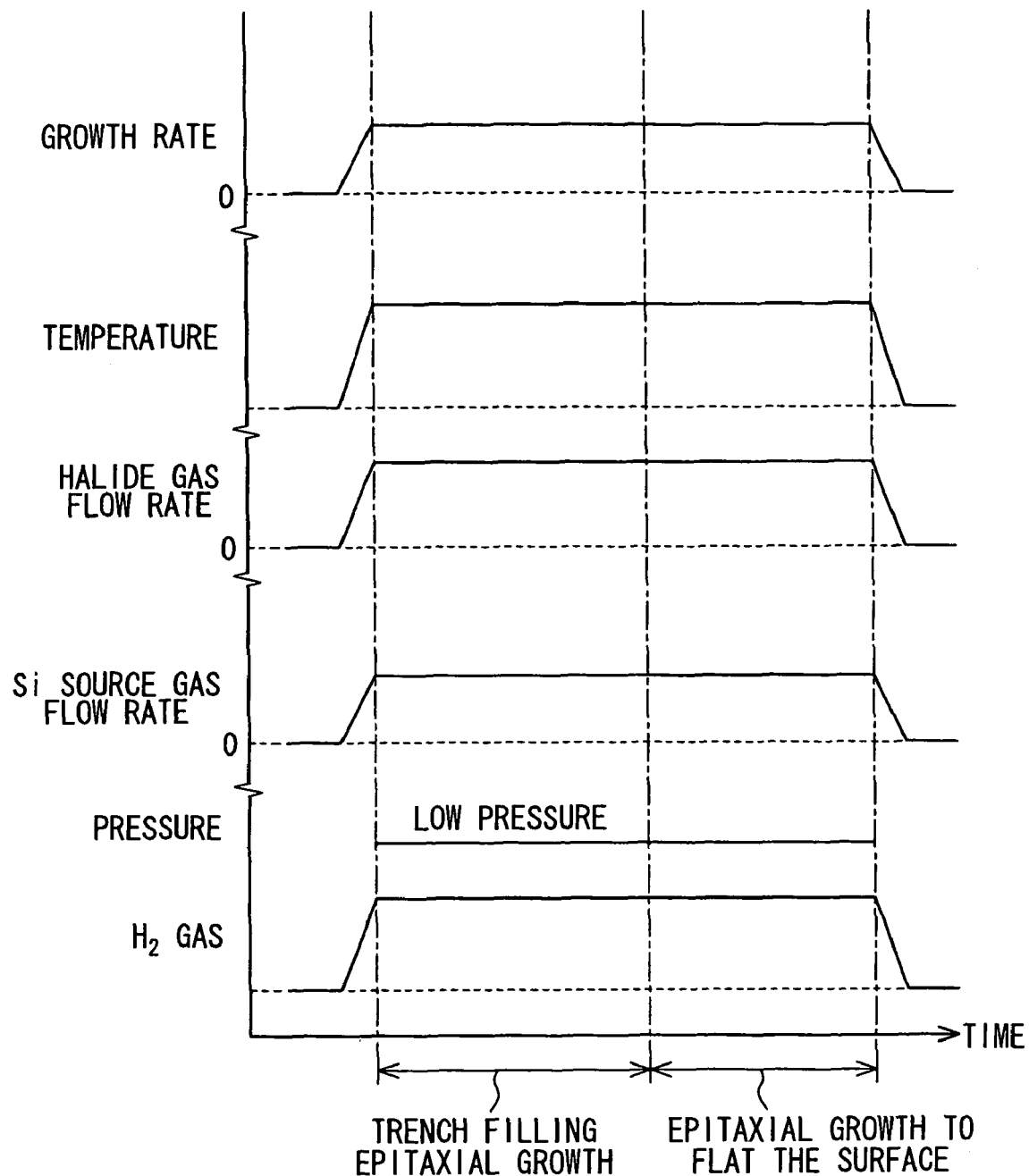
FIG. 25 is a timing chart showing a manufacturing process of the MOSFET shown in FIGS. 24A to 24F.

As shown in FIG. 24A, an n type epitaxial film 101 is formed on an n⁺ silicon substrate 100. As shown in FIG. 24B, a trench 102 is formed by etching with respect to the n type epitaxial film 101. As shown in FIGS. 24C and 24D, an epitaxial film 104 is formed by performing trench filling epitaxy using the silicon source gas and the halide gas. As shown in FIG. 24E, an epitaxial film 105 is formed by performing flattening epitaxy. As shown in FIG. 24F, the epitaxial films 104, 105 are then polished. Thus, selective growth can be performed from a trench bottom portion by simultaneously flowing the silicon source gas such as DCS, etc. and the halide gas such as HCl, etc. so as to realize trench filling epitaxy without void. Since the halide gas is used, the selective growth from the trench bottom portion becomes dominant since the growth of silicon on the substrate main surface and in the trench opening portion can be particularly restrained.

In such a substrate manufacturing process, film formation is performed under a reaction rate determining condition of low temperature so as to perform trench filling epitaxy without void. Further, selective epitaxy using the halide gas such as HCl, etc. is used. When flattening epitaxy is performed by using this trench filling condition, the growth rate is slow so that throughput gets worse. Further, since the selective growth using the silicon source gas and the halide gas is used, the growth rate is small by an attaching effect due to a halogen element on the substrate main surface as shown in FIG. 9. Further, it is necessary to improve throughput of a polishless process or a polishing process by reducing a polishing amount.

In contrast to this, the following construction is set in this embodiment mode.

Differing from the trench filling epitaxial process, no selectivity is not required in the flattening epitaxy. Therefore, a film forming condition such as film formation under the diffusion limited condition due to lowering of the film forming temperature, and silicon growing restraint in the trench opening portion due to the halide gas is not required. Therefore, as a flattening epitaxial condition, for example, supply of HCl gas is stopped and the film forming condition is switched from the diffusion limited condition to a supply limited condition, etc. Thus, a film forming time required in the flattening epitaxy is shortened and throughput of the trench epitaxial process can be improved.

In accordance with the above embodiment mode, the following effects can be obtained.

(1) As a manufacturing method of the semiconductor substrate, a first process, a second process and a third process are arranged. In the first process, the trench 4 is formed on the main surface 2a of the silicon substrates 1, 2. In the second process, the epitaxial film 20 is formed on the main surface 2a of the silicon substrates 1, 2, including the interior of the trench 4 by the epitaxial growth caused by supplying the mixing gas of the silicon source gas and the halide gas, and the interior of the trench 4 is filled by the epitaxial film 20. In the third process, the epitaxial film 21 is formed on the epitaxial film 20 for filling in the second process so as to perform flattening under a condition faster than the growth rate of the epitaxial film 20 on the main surface 2a of the silicon substrates 1, 2, in the second process. Accordingly, in the second process, the epitaxial film 20 is formed on the main surface 2a of the silicon substrates 1, 2, including the interior of the trench 4 by the epitaxial growth caused by supplying the mixing gas of the silicon source gas and the halide gas. The interior of the trench 4 is then filled by the epitaxial film 20. In this method, a void in trench filling epitaxy is restrained by the supply of the halide gas. Further, in the third process, the epitaxial film 21 is formed on the epitaxial film 20 for filling in the second process under the condition faster than the growth rate of the epitaxial film 20 on the main surface 2a of the silicon substrates 1, 2, in the second process so that throughput is improved. Further, polishing can be set to be unnecessary. Thus, the substrate can be easily flattened after the trench is filled by the epitaxial film while the void in the trench filling epitaxy is restrained.

(2) In the third process, after the epitaxial film 21 is formed under the condition faster than the growth rate of the epitaxial film 20 on the main surface 2a of the silicon substrates 1, 2, in the second process, the epitaxial films 20, 21, on the main surface 2a side of the silicon substrates 1, 2, are polished. Thus, the flattening can be further performed.

(3) In the third process, one of the following contents is executed so as to form the epitaxial film 21 under the condition faster than the growth rate of the epitaxial film 20 on the main surface 2a of the silicon substrates 1, 2, in the second process.

(A) The flow rate of the halide gas is reduced at the epitaxial growing time in the third process in comparison with that at the epitaxial growing time in the second process.

(B) The halide gas is set not to be flowed at the epitaxial growing time in the third process.

(C) The flow rate of the silicon source gas is increased at the epitaxial growing time in the third process in comparison with that at the epitaxial growing time in the second process.

(D) The growth temperature is raised at the epitaxial growing time in the third process in comparison with that at the epitaxial growing time in the second process.

(E) The growth pressure is raised at the epitaxial growing time in the third process in comparison with that at the epitaxial growing time in the second process.

(4) Efficiency is good when both the epitaxial growths of the second process and the third process are performed in pressure reduction CVD.

(5) In the third process, the epitaxial film 21 is formed under a condition faster than the growth rate of the epitaxial film 20 on the main surface 2a of the silicon substrates 1, 2, in the second process. Therefore, when switching to the epitaxial growth in the third process is performed after the epitaxial growth in the second process is terminated, at least two or more of the respective parameters of the flow rate of the halide gas, the flow rate of the silicon source gas, the growth temperature and the growth pressure are simultaneously switched so as to attain a high growth rate condition. Thus, throughput can be further improved.

(6) In the second process, the surface temperature of the epitaxial film 20 for filling into the trench 4 from the main surface 2a side of the silicon substrates 1, 2, is monitored by the thermometer 35. At a time point at which no output signal level of the thermometer 35 at a predetermined measuring temperature is changed, it is switched to a condition for increasing the growth rate in the third process. Thus, completion of the filling epitaxy can be reliably detected.

(7) The chuck base 31, the first gas flow rate adjusting means 36a, the second gas flow rate adjusting means 36b, the temperature adjusting means 37, the pressure adjusting means 34, the thermometer 35 and the switching means 38 are arranged as the epitaxial growing device. The chuck base 31 is arranged within the chamber 30, and fixes the silicon substrate 32 in which the trench is formed on the main surface. The first gas flow rate adjusting means 36a adjusts the flow rate of the silicon source gas supplied into the chamber 30 for the epitaxial growth. The second gas flow rate adjusting means 36b adjusts the flow rate of the halide gas supplied into the chamber 30 at the epitaxial growing time. The temperature adjusting means 37 adjusts the growth temperature within the chamber 30. The pressure adjusting means 34 adjusts the growth pressure within the chamber 30. The thermometer 35 monitors the surface temperature at the epitaxial film forming time in the silicon substrate 32 fixed to the chuck base 31 within the chamber 30. In the switching means 38, the surface temperature of the epitaxial film filled into the trench is monitored by the thermometer 35 from the main surface side of the silicon substrate 32. At a time point t2 at which no output signal level of the thermometer 35 at a predetermined measuring temperature is changed, the switching means 38 controls at least one of the flow rate of the silicon source gas, the flow rate of the halide gas, the growth temperature and the growth pressure by at least one of the first gas flow rate adjusting means 36a, the second gas flow rate adjusting means 36b, the temperature adjusting means 37 and the pressure adjusting means 34. The switching means 38 then performs switching to the condition for increasing the growth rate.

Accordingly, filling epitaxy and subsequent flattening epitaxy can be automatically controlled.

The epitaxial growth in the second process may be performed by a pressure reduction CVD growing method, and the epitaxial growth in the third process may be also performed by a normal pressure CVD growing method.

Figure 13:
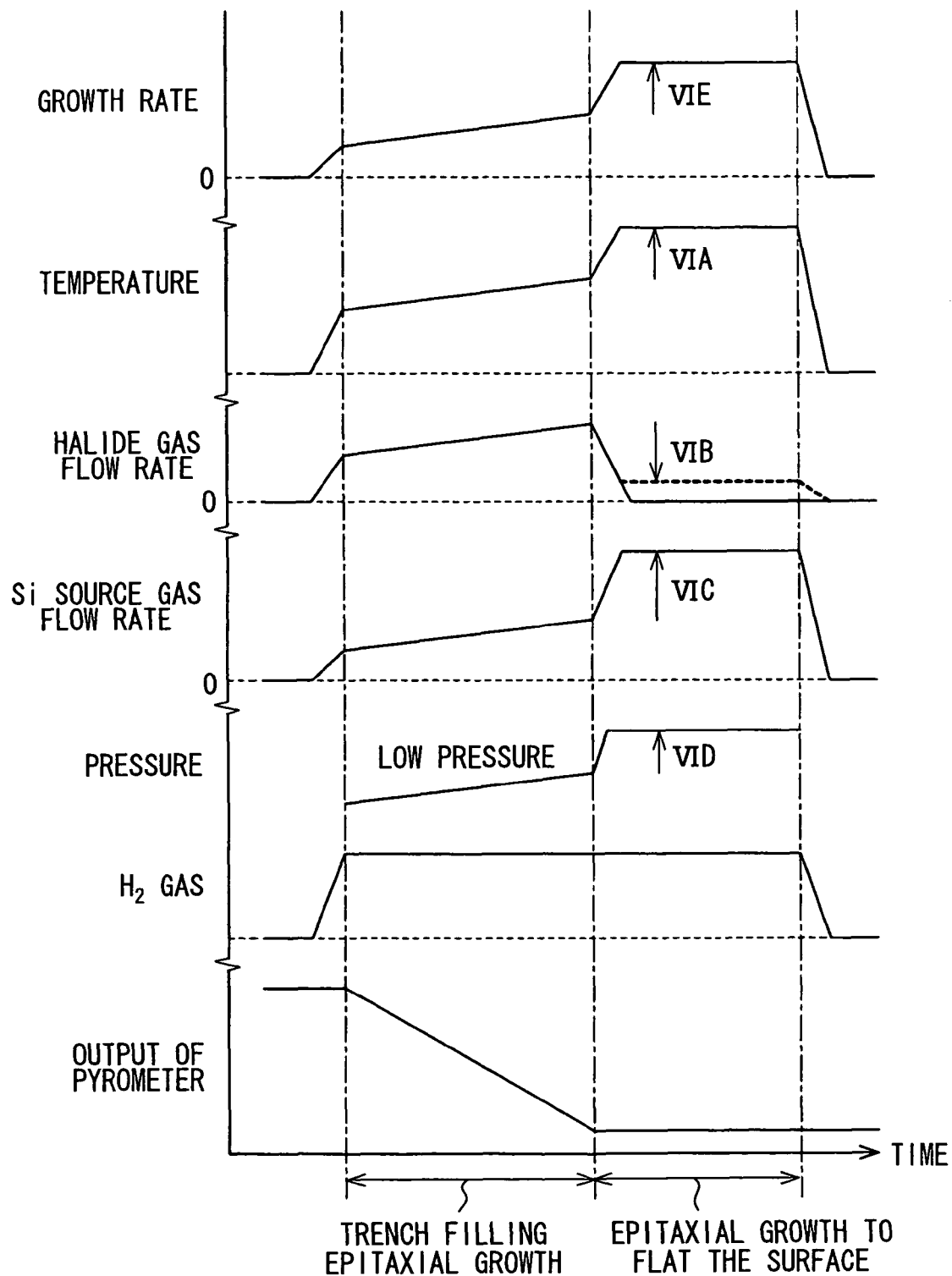
FIG. 13 is another timing chart showing a manufacturing process of the MOSFET.
Figure 14:
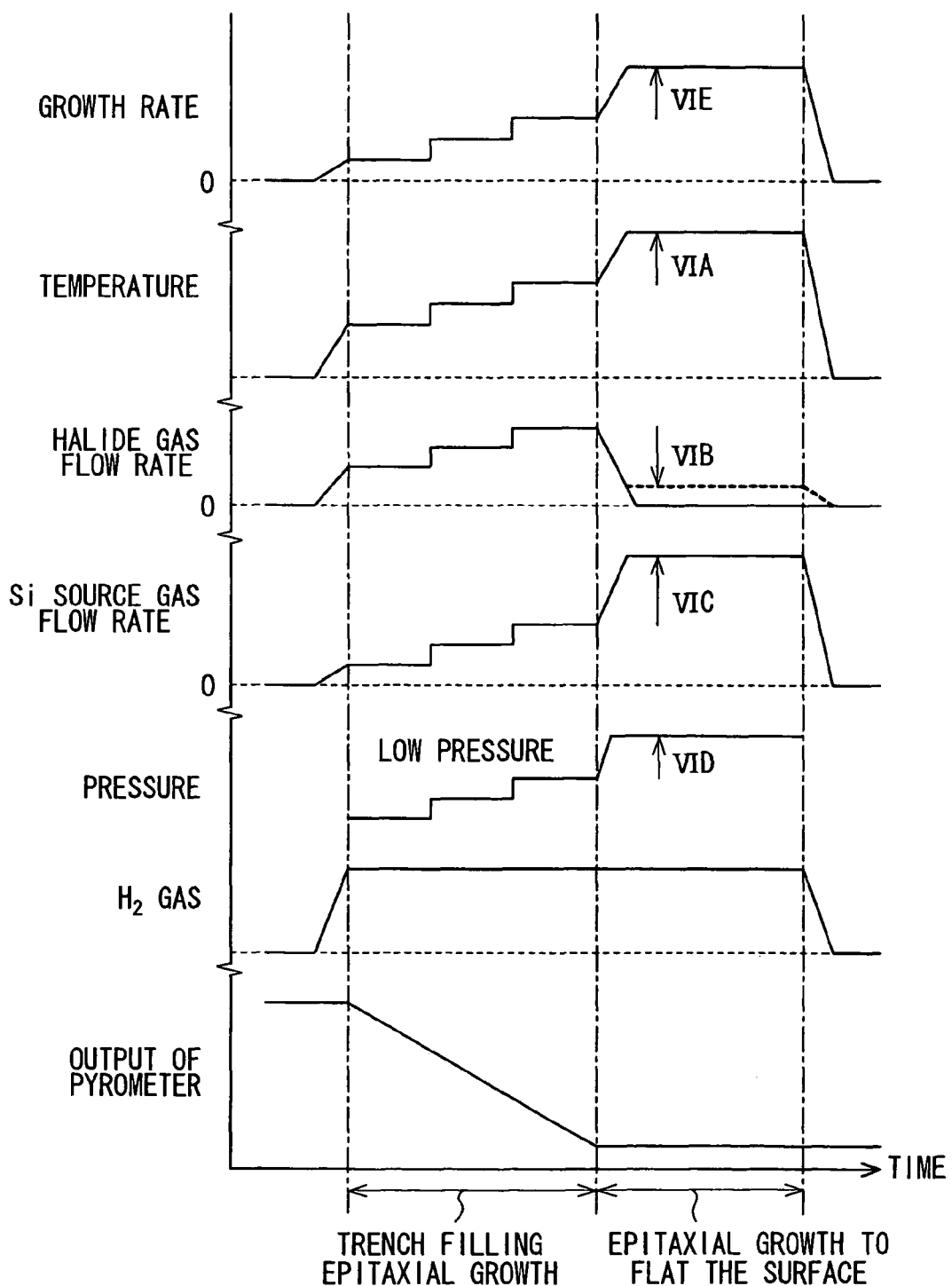
FIG. 14 is further another timing chart showing a manufacturing process of the MOSFET.

Further, at least one of the respective parameters of the flow rate of the halide gas, the flow rate of the silicon source gas, the growth temperature and the growth pressure may be also gradually continuously adjusted during the filling epitaxial growth (during the epitaxial growth of the second process) so as to attain a high growth rate condition as shown in FIG. 13, or may be also adjusted in a stepwise shape so as to attain the high growth rate condition as shown in FIG. 14. In these growing parameters, one parameter may be also changed, and plural parameters may be also combined.

Figure 15A:
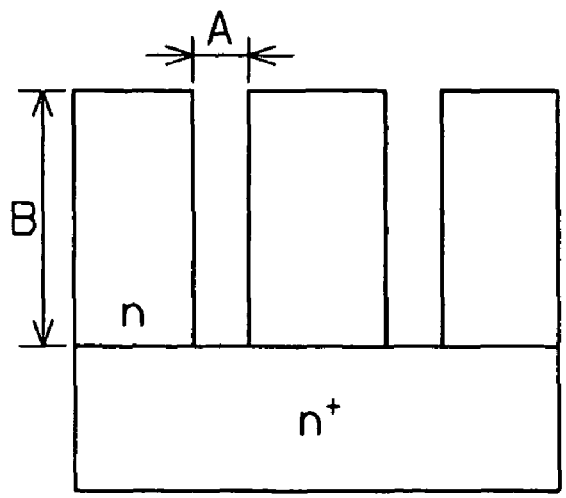
FIGS. 15A and 15B are cross sectional views explaining an epitaxial growth process.
Figure 15B:
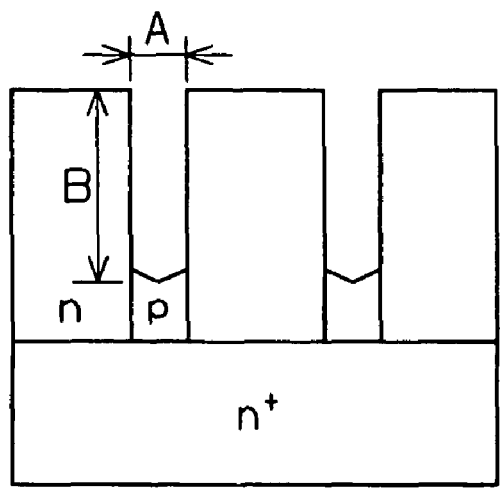

Thus, the growth rate of the filling epitaxy is reduced (high selecting ratio film forming condition) when the aspect ratio of a trench filling initial period is large as shown in FIG. 15A. This growth rate is increased when the aspect ratio is small as shown in FIG. 15B. Thus, time required in the filling can be shortened. Namely, throughput of an entire trench epitaxial process can be also improved at the trench filling epitaxial time by changing the film forming condition in conformity with a change of the aspect ratio in the filling epitaxial process of the trench.

Second Embodiment Mode

Next, a second embodiment mode will be mainly explained with different points from the first embodiment mode.

FIGS. 16A to 16E show manufacturing process views in this embodiment mode substituted for FIGS. 2A to 2C and 3A to 3C. FIG. 17 is a time chart in this embodiment mode substituted for FIG. 6.

Figure 16A:
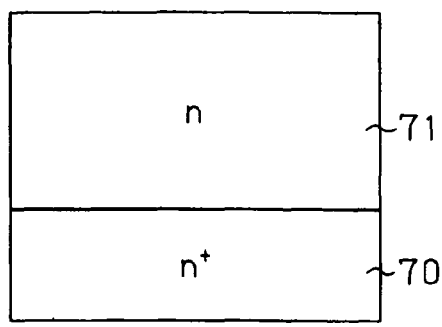
FIG. 16A to 16E are cross sectional views explaining another method for manufacturing the MOSFET.
Figure 16D:
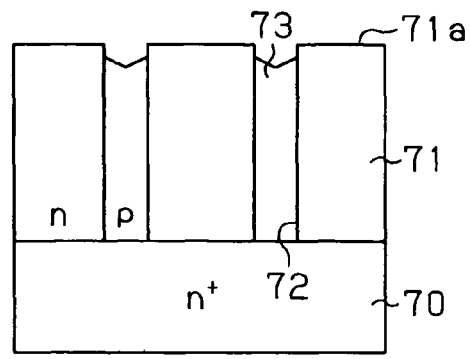
Figure 16B:
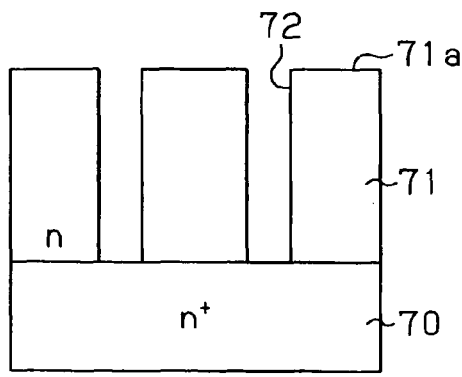
Figure 17:
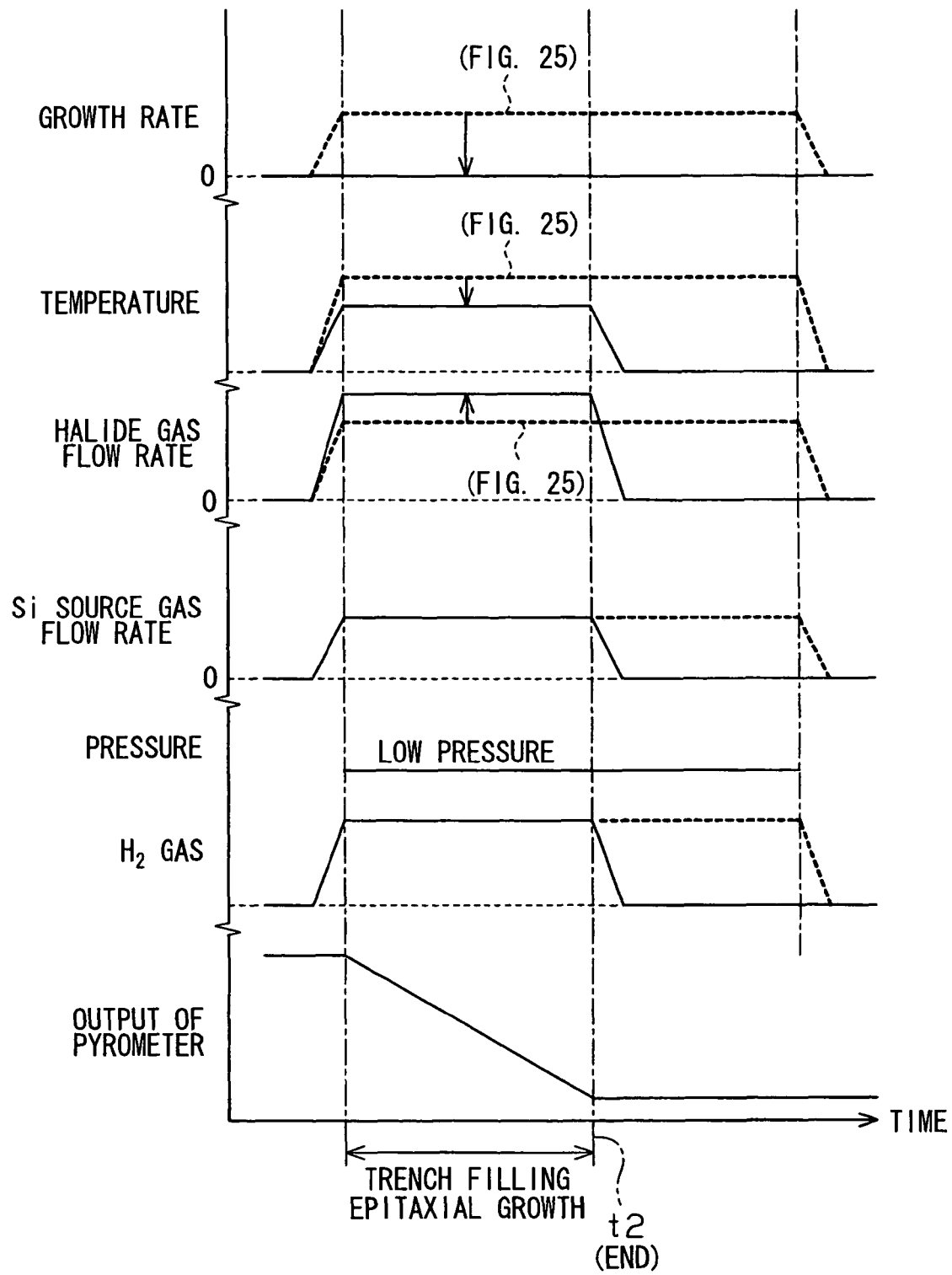
FIG. 17 is a timing chart showing a manufacturing process of the MOSFET shown in FIGS. 16A to 16E.

As shown in FIG. 16A, an epitaxial film 71 is formed on a silicon substrate 70 and is set to a silicon substrate. As shown in FIG. 16B, a trench 72 is formed on a main surface 71a of the silicon substrates 70, 71, (first process).

Figure 16E:
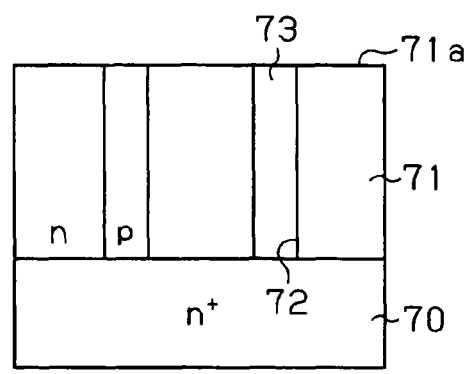
Figure 16C:
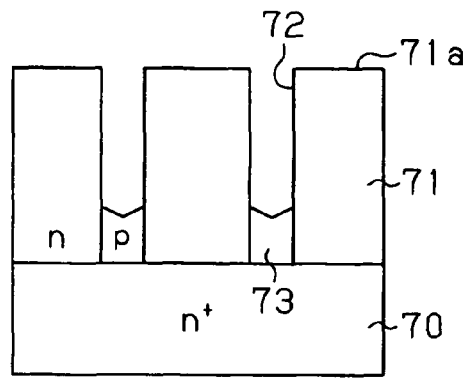

Thereafter, as shown in FIG. 16C, an epitaxial film 73 is formed in only the interior of the trench 72 without growing this epitaxial film on the main surface 71a of the silicon substrates 70, 71, by the epitaxial growth caused by supplying the mixing gas of the silicon source gas and the halide gas. At this time, as shown in FIG. 17, an epitaxial condition of a high selectivity in the trench filling epitaxy is set by increasing the flow rate of the halide gas, or lowering the growth temperature in comparison with the comparison example of FIG. 25. An epitaxial film 73 is grown in only the interior of the trench 72 without growing this epitaxial film on the main surface 71a of the silicon substrates 70, 71. More particularly, the growth is performed from a trench bottom face. As shown in FIGS. 16D and 16E, the trench 72 is filled by the epitaxial film 73 until this epitaxial film 73 has the same face as the main surface 71a of the silicon substrates 70, 71, (second process).

Thus, in the second process, the epitaxial film 73 is grown in only the interior of the trench 72 without growing this epitaxial film on the main surface 71a of the silicon substrates 70, 71, by the epitaxial growth caused by supplying the mixing gas of the silicon source gas and the halide gas. Further, the trench 72 is filled by the epitaxial film 73 until the epitaxial film 73 has the same face as the main surface 71a of the silicon substrates 70, 71. In this filling, a void in the trench filling epitaxy layer can be restrained by the supply of the halide gas. Accordingly, since no film is formed on the main surface 71a, a polishing process can be omitted (polishing can be set to be unnecessary). Thus, the substrate can be easily flattened after the trench is filled by the epitaxial film while the void in the trench filling epitaxy layer is restrained.

Third Embodiment Mode

Next, a third embodiment mode will be mainly explained with different points from the first embodiment mode.

FIGS. 18A to 18F show manufacturing process views in this embodiment mode substituted for FIGS. 2A to 2C and FIGS. 3A to 3C. FIG. 19 is a time chart in this embodiment mode substituted for FIG. 6.

Figure 18A:
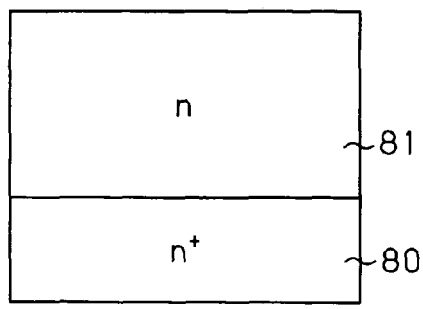
FIG. 18A to 18F are cross sectional views explaining further another method for manufacturing the MOSFET.
Figure 18B:
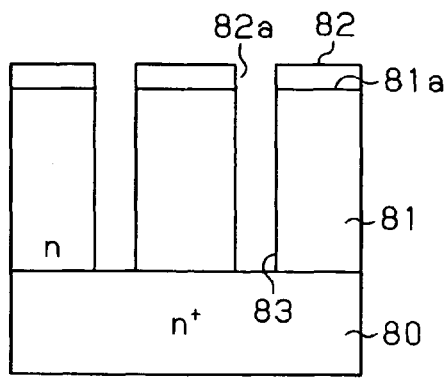
Figure 19:
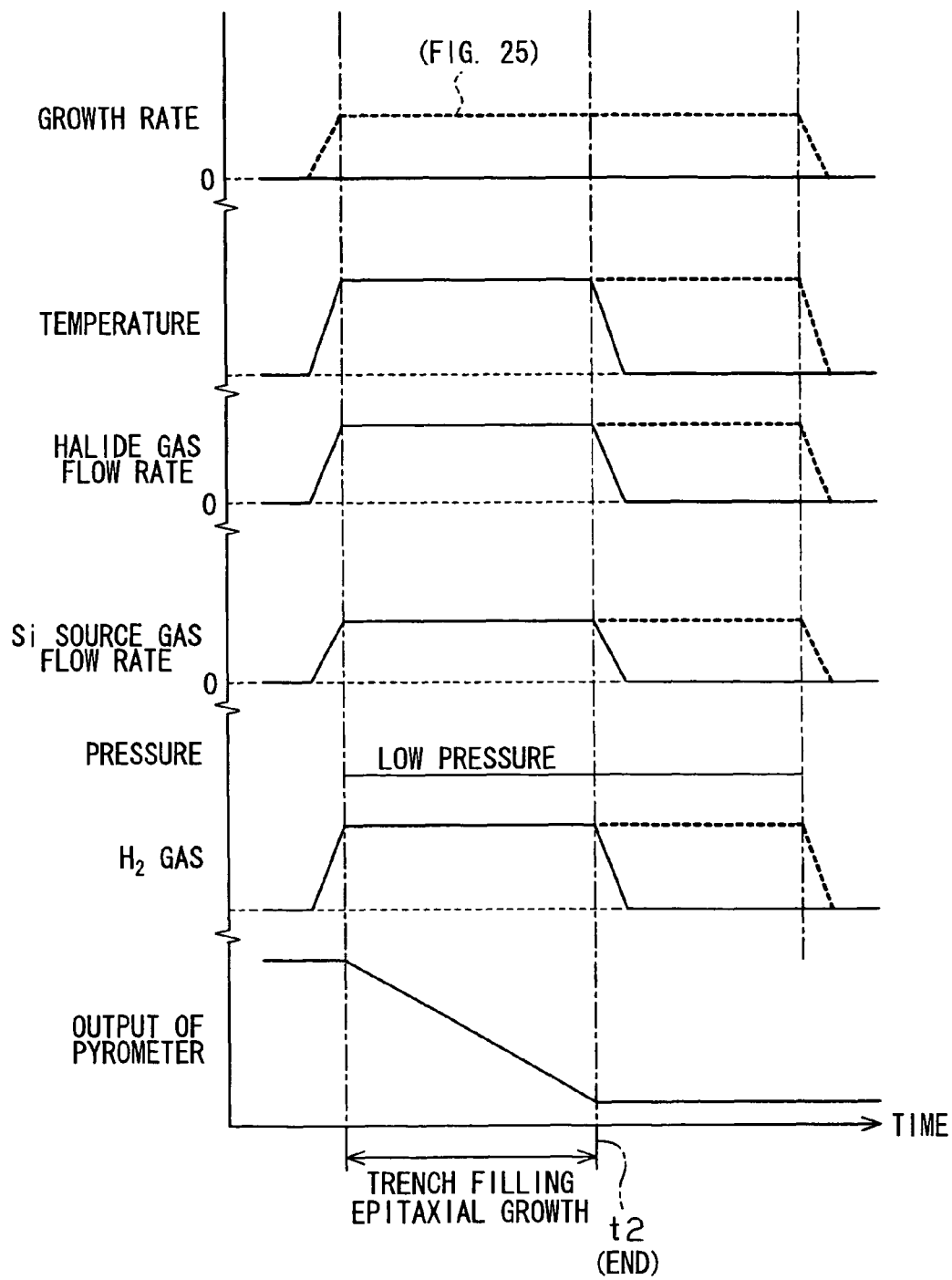
FIG. 19 is a timing chart showing a manufacturing process of the MOSFET shown in FIGS. 18A to 18F.

As shown in FIG. 18A, the silicon substrate is constructed by forming an epitaxial film 81 on a silicon substrate 80. As shown in FIG. 18B, a mask 82 for trench formation is then arranged on a main surface 81a of the silicon substrates 80, 81. A trench 83 is formed by etching the silicon substrate 81 from a mask opening portion 82a for trench formation in the mask 82 (first process). A silicon oxide film is used as the mask 82.

Figure 18D:
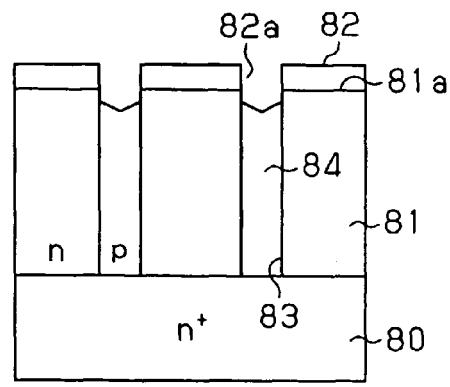
Figure 18E:
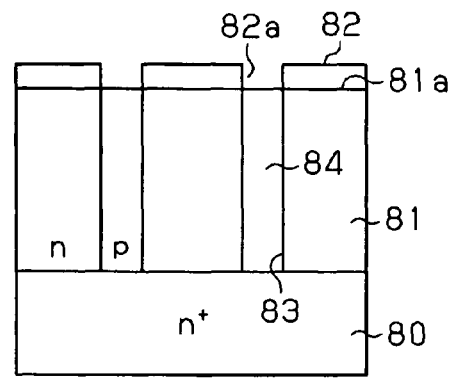
Figure 18C:
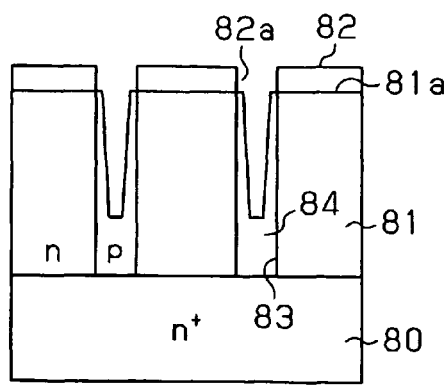

Thereafter, as shown in FIGS. 18C and 18D, an epitaxial film 84 is grown in only the interior of the trench 83 by low pressure epitaxial growth caused by supplying the mixing gas of the silicon source gas and the halide gas in a state in which the mask 82 is left. Further, as shown in FIG. 18E, the trench 83 is filled by the epitaxial film 84 until the epitaxial film 84 has the same face as the main surface 81a of the silicon substrates 80, 81, (second process). Namely, as shown in FIG. 19, film formation is performed on the substrate main surface in the case of FIG. 25. However, in this embodiment mode, filling is performed within the trench 83 without performing the growth on the substrate main surface 81a (on an oxide film) by utilizing the selectivity of silicon (Si) and a silicon oxide film ($SiO_2$) with respect to the film forming condition. In this filling, a void in the trench filling epitaxy layer is restrained by the supply of the halide gas.

Figure 18F:
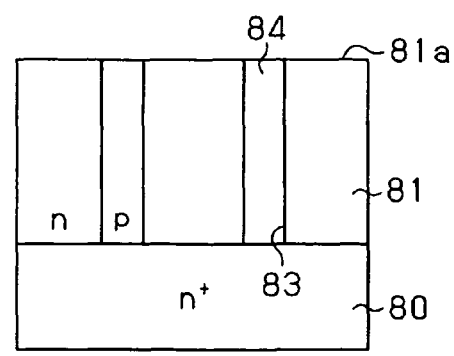

As shown in FIG. 18F, the mask 82 is removed (third process).

Thus, in this embodiment mode, since no film is formed on the main surface 81a, a polishing process can be omitted (polishing can be set to be unnecessary). Thus, the substrate can be easily flattened after the trench is filled by the epitaxial film while the void in the trench filling epitaxy layer is restrained.

Fourth Embodiment Mode

A fourth embodiment mode will next be mainly explained with different points from the first embodiment mode.

FIGS. 20A to 20F show manufacturing process views in this embodiment mode substituted for FIGS. 2A to 2C and 3A to 3C. FIG. 21 is a time chart in this embodiment mode substituted for FIG. 6.

Figure 20A:
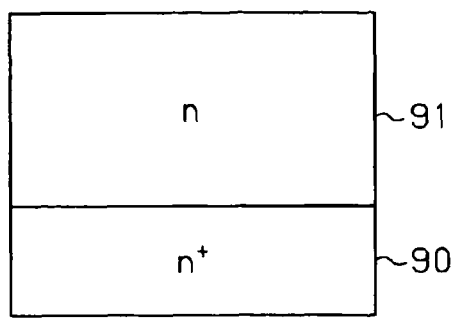
FIG. 20A to 20F are cross sectional views explaining another method for manufacturing the MOSFET.
Figure 20B:
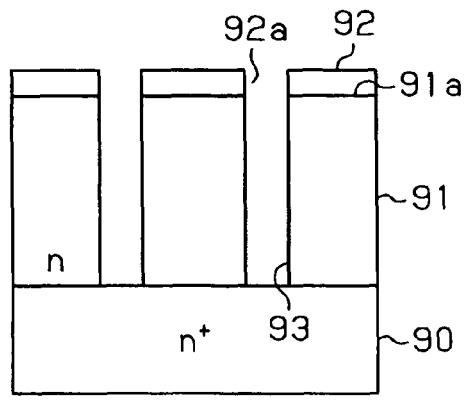
Figure 21:
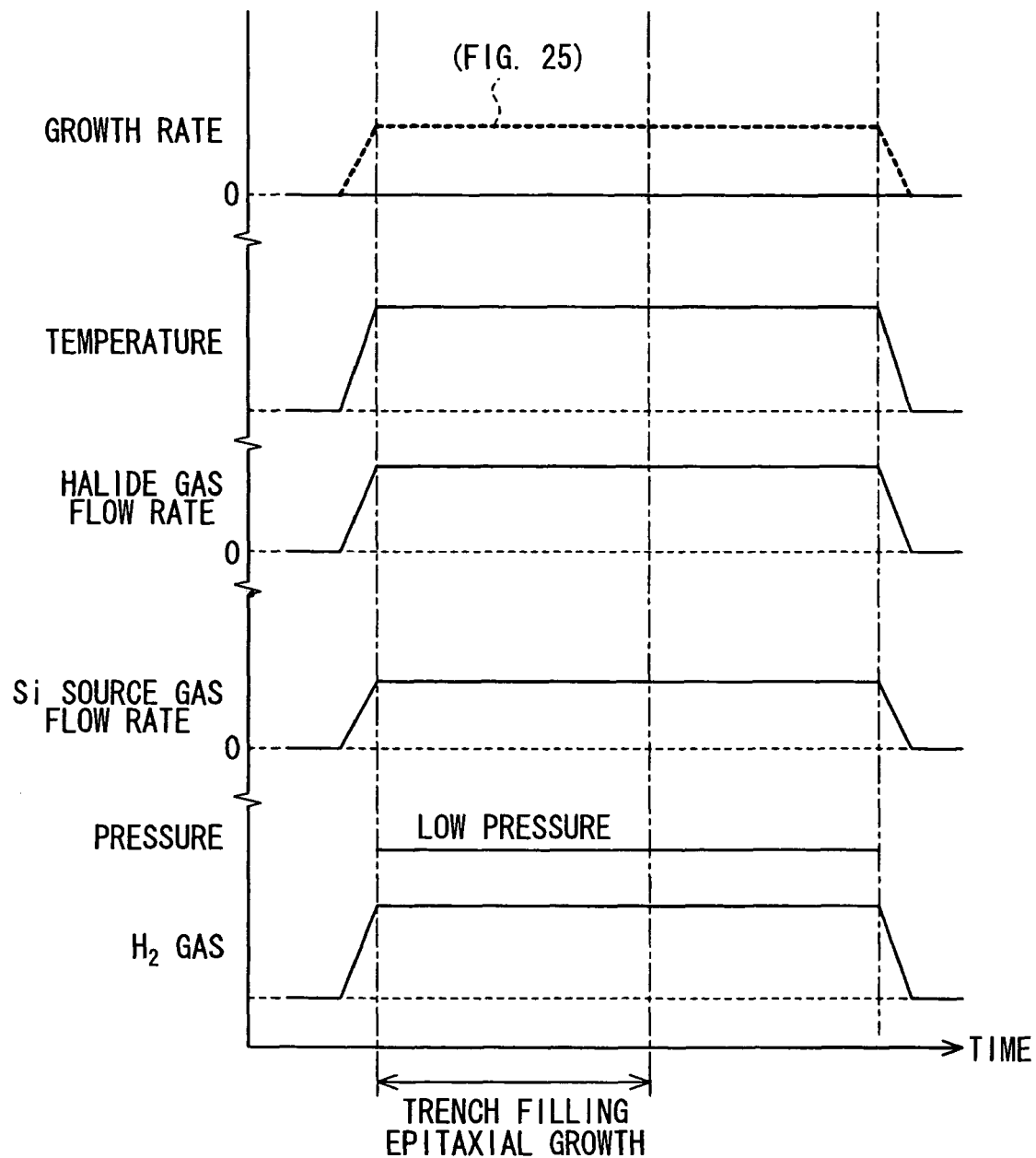
FIG. 21 is a timing chart showing a manufacturing process of the MOSFET shown in FIGS. 20A to 20F.

As shown in FIG. 20A, an epitaxial film 91 is formed on a silicon substrate 90, and constitutes a silicon substrate. As shown in FIG. 20B, a mask 92 for trench formation is then arranged on a main surface 91a of the silicon substrates 90, 91. A trench 93 is then formed by etching a silicon substrate 91 from a mask opening portion 92a for trench formation in the mask 92 (first process). A silicon oxide film is used as the mask 92.

Figure 20C:
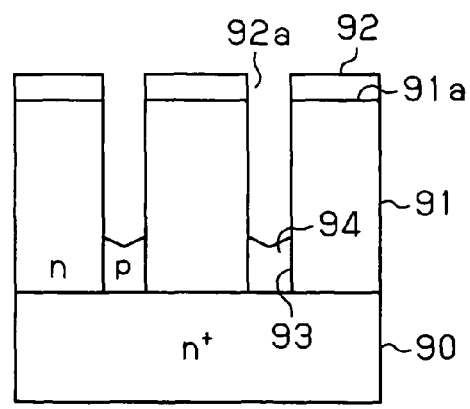
Figure 20D:
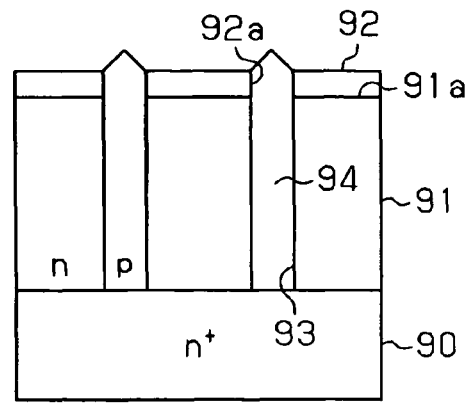

Thereafter, as shown in FIG. 20C, in a state in which the mask 92 is left, an epitaxial film 94 is grown in only the interior of the trench 93 by low pressure epitaxial growth caused by supplying the mixing gas of the silicon source gas and the halide gas. Further, as shown in FIG. 20D, the trench 93 is filled by the epitaxial film 94 until the epitaxial film 94 becomes higher than the surface of the mask 92 for trench formation (second process). Namely, as shown in FIG. 21, no growth is performed on the mask 92 by using a selecting epitaxial condition using the silicon source gas and the halide gas. In this filling, a void in the trench filling epitaxy layer is restrained by the supply of the halide gas.

Figure 20E:
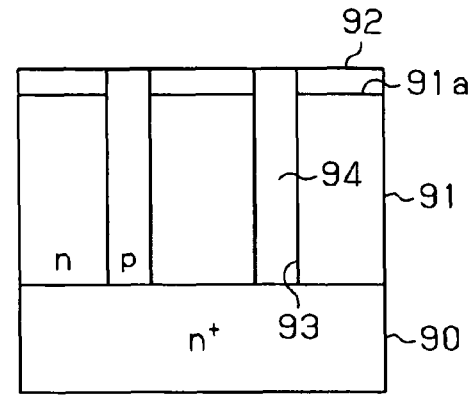

Further, as shown in FIG. 20E, the epitaxial film 94 of the side of a main surface 91a of the silicon substrates 90, 91, is polished with the mask 92 as a stopper, and the main surface 91a side of the silicon substrates 90, 91, is flattened (third process). At this time, the polishing is performed with the mask (oxide film) 92 as a terminal point. In this case, a polishing area is only an epitaxially filled area in comparison with a case in which an entire silicon face is polished. Accordingly, since a polishing amount can be reduced, throughput can be improved. Further, since dispersion of the polishing is determined by film thickness dispersion of the mask (oxide film) 92, a film thickness uniform property of a p/n column layer within the face is also improved.

Figure 20F:
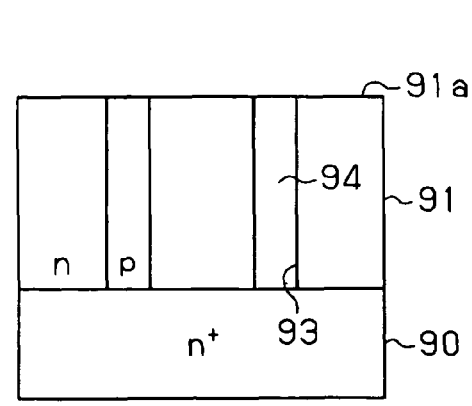

Subsequently, the mask 92 is removed (fourth process). As shown in FIG. 20F, the main surface 91 a side of the silicon substrates 90, 91, is oxidized as a sacrificial layer and this sacrificial oxide film is removed so as to be more perfectly flattened. The sacrificial layer oxidation and the removal of the sacrificial oxide film may be performed in accordance with necessity.

Thus, in this embodiment mode, a polishing amount can be reduced and the substrate can be easily flattened by using the mask as a stopper after the trench is filled by the epitaxial film while a void in the trench filling epitaxy layer is restrained.

Fifth Embodiment Mode

Next, a fifth embodiment mode will be mainly explained with different points from the fourth embodiment mode.

FIGS. 22A to 22E show manufacturing process views in this embodiment mode.

As shown in FIG. 20A mentioned before, an epitaxial film 91 is formed on a silicon substrate 90. As shown in FIG. 20B, a mask 92 for trench formation is arranged on a main surface 91a of the silicon substrates 90, 91. A trench 93 is formed by etching the silicon substrate 91 from a mask opening portion 92a for trench formation in the mask 92 (first process).

Figure 22A:
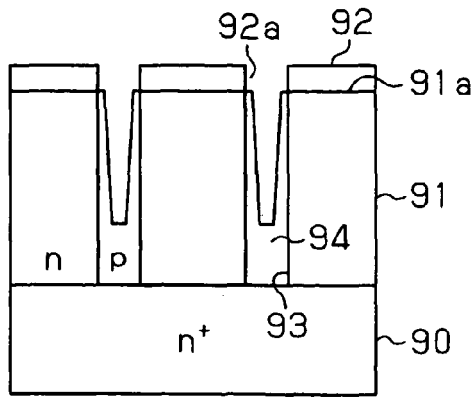
FIG. 22A to 22E are cross sectional views explaining another method for manufacturing the MOSFET.
Figure 22D:
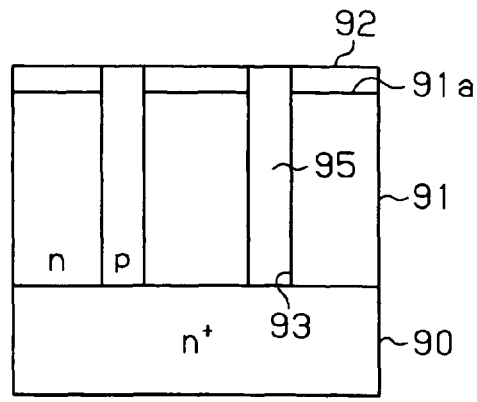
Figure 22B:
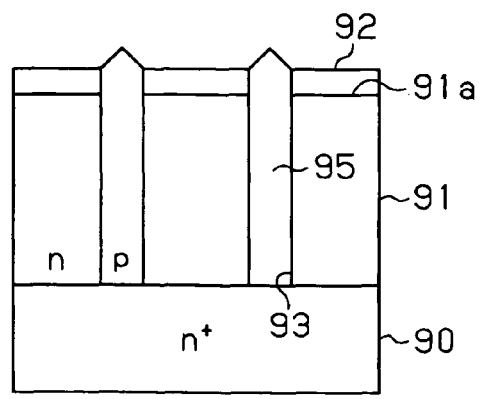
Figure 22E:
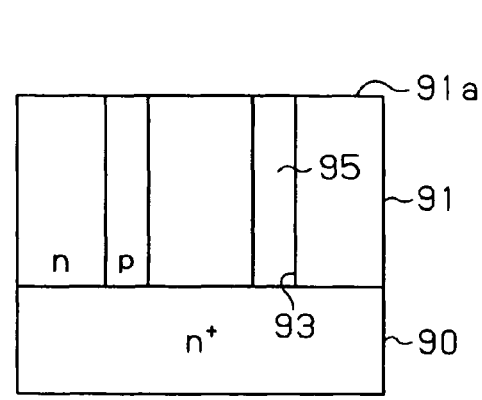
Figure 22C:
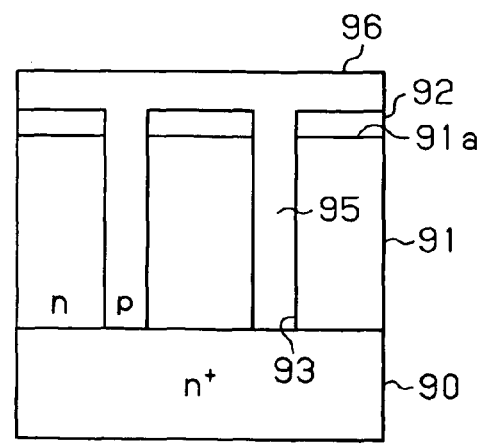

As shown in FIGS. 22A, 22B and 22C, in a state in which the mask 92 is left, film formation is performed on the mask 92 including the interior of the trench 4 by epitaxial growth caused by supplying the mixing gas of the silicon source gas and the halide gas, and the trench 93 is filled by an epitaxial film 95 (second process). In this method, a void in the trench filling epitaxy layer is restrained by the supply of the halide gas. At this time, a film on an upper face of the mask 92 may be a film (film of monocrystal) 96 formed as a monocrystal, and a film (film of polycrystal) 97 formed as a polycrystal as shown in FIG. 23C. Namely, when film thickness of the trench filling epitaxial growth is increased, a finishing structure is different in accordance with a selectivity, i.e., the ratio of the halide gas and the silicon source gas. When the selectivity is high (when the flow rate of the halide gas is increased), the monocrystal is grown on the mask (oxide film) 92. In contrast to this, when the selectivity is low (when HCl is small), polycrystal silicon is grown on the entire face or one portion of the mask (oxide film) 92. Thus, in the second process, the film 96 of the monocrystal may be formed on the mask, and the film 97 of the polycrystal may be also formed on the mask by the epitaxial growth caused by supplying the mixing gas of the silicon source gas and the halide gas.

Figure 23A:
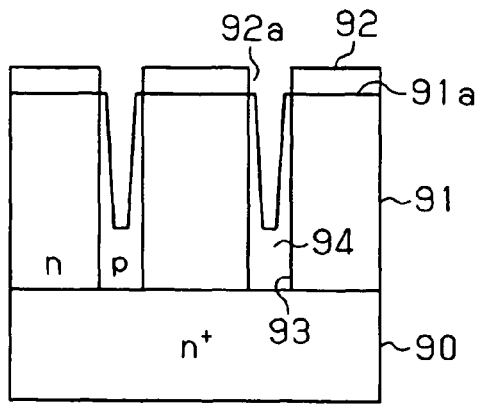
FIG. 23A to 23E are cross sectional views explaining further another method for manufacturing the MOSFET.
Figure 23D:
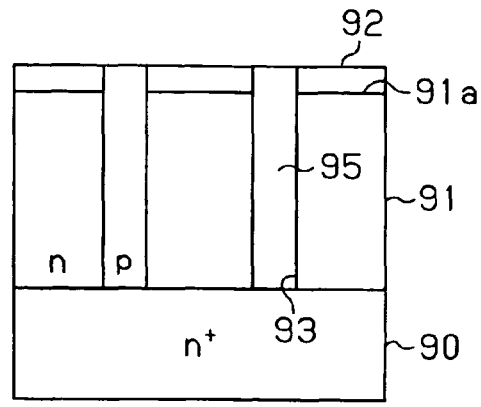
Figure 23B:
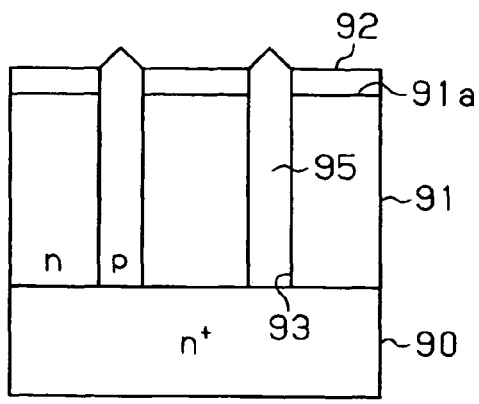
Figure 23E:
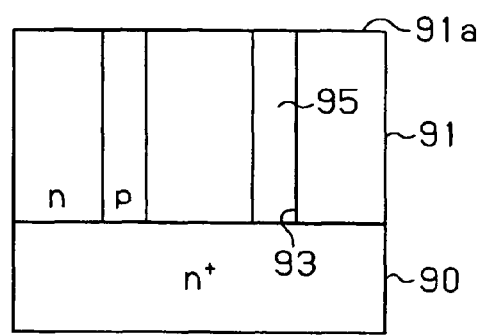
Figure 23C:
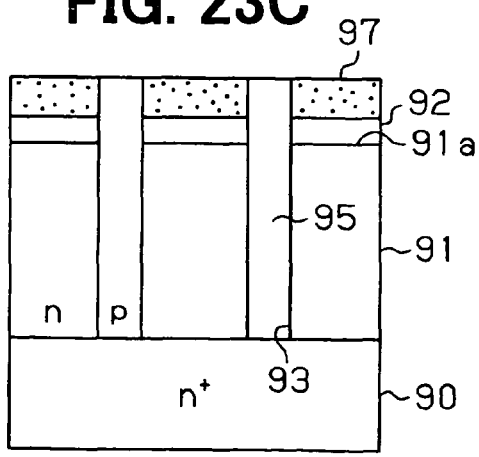

Thereafter, as shown in FIGS. 22D and 23D, the films (the films 95, 96 of FIG. 22C and the films 95, 97 of FIG. 23C) of an upper side of the mask 92 are polished with the mask 92 as a stopper. The main surface 91a side of the silicon substrates 90, 91, is then flattened (third process).

Subsequently, as shown in FIG. 22E, the mask 92 is removed (fourth process). Thereafter, the main surface 91a side of the silicon substrates 90, 91, is oxidized as a sacrificial layer and this sacrificial oxide film is removed so as to be more perfectly flattened. The sacrificial oxide layer and the removal of the sacrificial oxide film may be performed in accordance with necessity.

Thus, in this embodiment mode, the substrate can be easily flattened by using the mask as a stopper after the trench is filled by the epitaxial film while a void in the trench filling epitaxial layer is restrained. In the second to fifth embodiment modes, as explained in the first embodiment mode, it is preferable to satisfy Y<0.2X+0.1, Y<0.2X+0.05 and Y<0.2X in accordance with the aspect ratio of the trench at the trench filling epitaxial time. Further, one of hydrogen chloride, chlorine, fluorine, chlorine trifluoride, hydrogen fluoride and hydrogen bromide is preferably used in the halide gas, and one of monosilane, disilane, dichlorosilane and trichlorosilane is preferably used in the silicon source gas. Further, in the trench, the bottom face is a (110)-plane and a (111)-plane is included on the side face. Otherwise, in the trench, it is preferable that the bottom face is a (100)-plane and the (100)-plane is included on the side face.

In the explanations made so far, the n type epitaxial film is formed in the $n^+$ substrate, and the trench is formed on its main surface (upper face) with this n type epitaxial film as a silicon substrate. However, the invention may be also applied to a case in which the trench is directly formed in a bulk substrate.

Sixth Embodiment Mode

Figure 26:
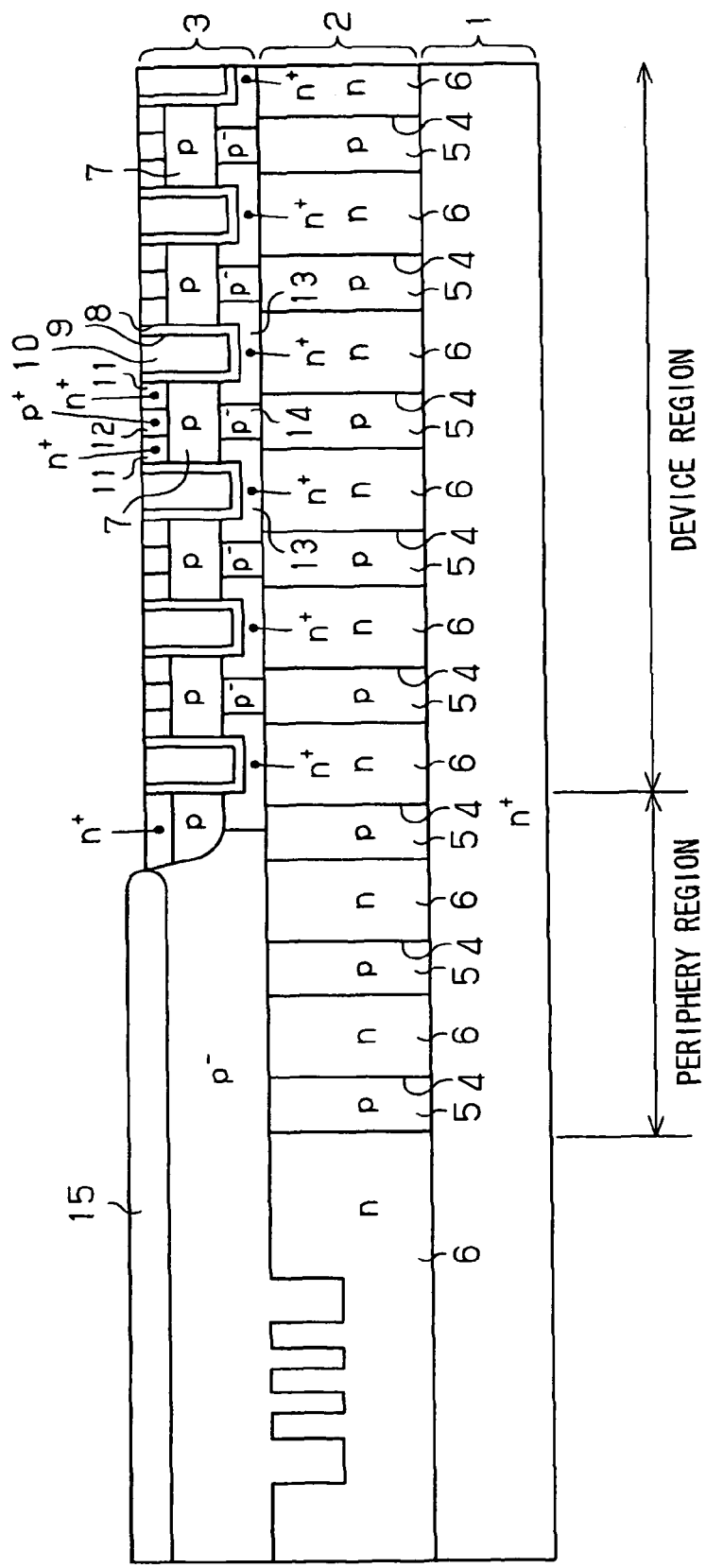
FIG. 26 is a cross sectional view showing another vertical type trench gate MOSFET.
Figure 27:
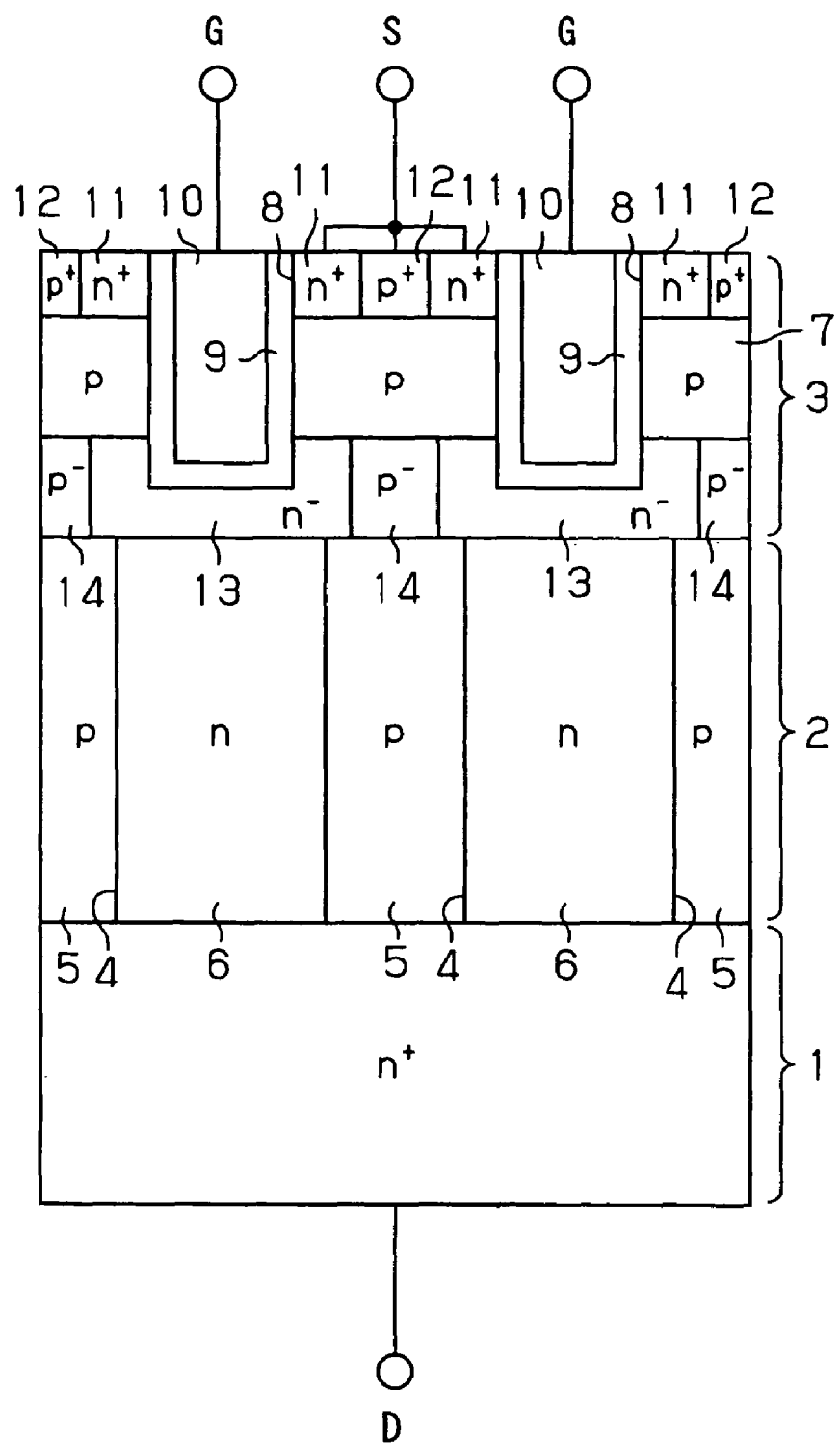
FIG. 27 is a partially enlarged cross sectional view showing the MOSFET shown in FIG. 26.

FIG. 26 shows a cross-sectional view of a longitudinal type trench gate MOSFET in this embodiment mode. FIG. 27 is an enlarged view of a main portion in an element portion in FIG. 26.

In FIG. 27, an epitaxial film 2 is formed on an $n^+$ silicon substrate 1 as a drain area, and an epitaxial film 3 is formed on this epitaxial film 2. A trench 4 is arranged in parallel in the epitaxial film 2 of the lower side. The trench 4 passes through the epitaxial film 2 and reaches the $n^+$ silicon substrate 1. An epitaxial film 5 is filled within the trench 4. An electric conductivity type of the epitaxial film 5 within the trench 4 is a p type and the electric conductivity type of a transversal area 6 of the trench 4 is an n type. Thus, the p type area 5 and the n type area 6 are alternately arranged in the transversal direction. Thus, a so-called super junction structure in which a drift layer of MOSFET has a p/n column structure is formed.

In the above epitaxial film 3 of the upper side, a p well layer 7 is formed in its surface layer portion. A trench 8 for a gate is arranged in parallel in the epitaxial film 3, and is formed so as to be deeper than the p well layer 7. A gate oxide film 9 is formed on an inner face of the trench 8. A polysilicon gate electrode 10 is arranged in an inner direction of the gate oxide film 9. An $n^+$ source area 11 is formed in a surface layer portion in a part abutting on the trench 8 on an upper face of the epitaxial film 3. Further, a $p^+$ source contact area 12 is formed in a surface layer portion on the upper face of the p type epitaxial film 3. An $n^-$ buffer area 13 is formed every trench 8 between the p well layer 7 in the epitaxial film 3 and the above epitaxial film 2 (drift layer). This $n^-$ buffer area 13 includes a bottom face portion of the trench 8, and abuts on the n type area 6 in the drift layer and also abuts on the p well layer 7. Further, a $p^-$ area 14 is formed between the $n^-$ buffer areas 13 every trench 8.

An unillustrated drain electrode is formed on a lower face of the $n^+$ silicon substrate 1, and is electrically connected to the $n^+$ silicon substrate 1. Further, an unillustrated source electrode is formed on the upper face of the epitaxial film 3, and is electrically connected to the $n^+$ source area 11 and the $p^+$ source contact area 12.

The transistor is turned on by applying a predetermined positive voltage as a gate electric potential in a state in which a source voltage is set to a ground electric potential and a drain voltage is set to a positive electric potential. When the transistor is turned on, an inversion layer is formed in a part abutting on the gate oxide film 9 in the p well layer 7. Electrons are flowed through this inversion layer between the source and the drain (from the $n^+$ source area 11, the p well layer 7, the $n^-$ buffer area 13, the n type area 6, to the $n^+$ silicon substrate 1). At a reverse bias applying time (in a state in which the source voltage is set to the ground electric potential and the drain voltage is set to the positive electric potential), a depletion layer is spread from a pn junction portion of the p type area 5 and the n type area 6, a pn junction portion of the $n^-$ buffer area 13 and a $p^-$ area 14, and a pn junction portion of the $n^-$ buffer area 13 and the p well layer 7. The p type area 5 and the n type area 6 are depleted and high withstand voltage is obtained.

On the other hand, in FIG. 26, the n type area 6 and the p type area 5 are also alternately arranged in the transversal direction in a terminal portion around an element section. Further, a LOCOS oxide film 15 is formed on an outer circumferential side from the element section on the upper face of the epitaxial film 3.

Next, a manufacturing method of the longitudinal type trench gate MOSFET in this embodiment mode will be explained.

Figure 28A:
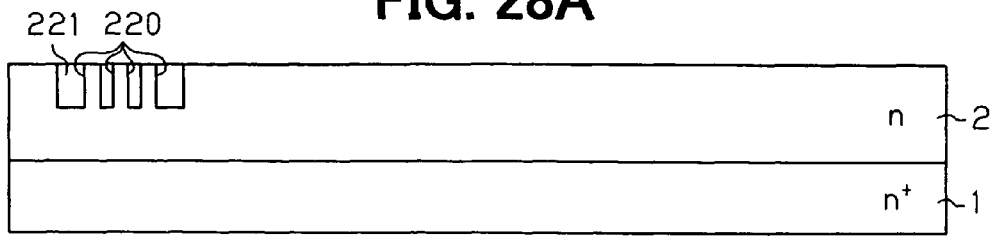
FIG. 28A to 28D are cross sectional views explaining a method for manufacturing the MOSFET shown in FIG. 26.

First, as shown in FIG. 28A, an n+ silicon substrate 1 is prepared and an epitaxial film 2 of the n type is formed on this n+ silicon substrate 1. Plural trenches 220 are then formed in the epitaxial film 2 in a chip outer circumferential portion, and a silicon oxide film 221 is filled within this trench 220. Further, the upper face of the epitaxial film 2 is flattened.

Figure 28B:
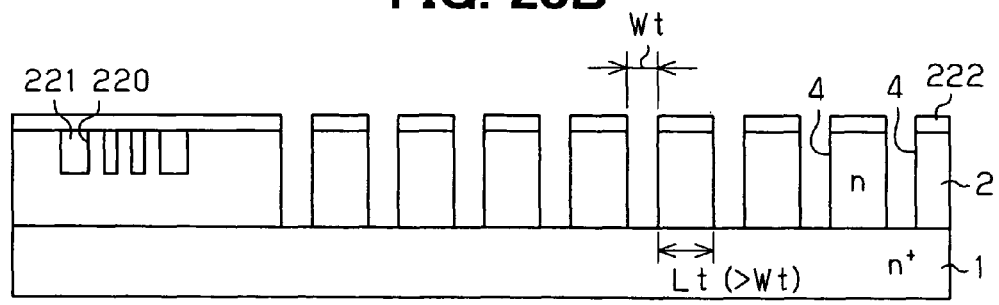

Subsequently, as shown in FIG. 28B, a silicon oxide film 222 is formed on the epitaxial film 2 of the n type, and is patterned in a predetermined shape so as to obtain a predetermined trench with respect to this silicon oxide film 222. Anisotropic etching (RIE), or wet etching using an alkaline anisotropic etching solution (KOH, TMAH, etc.) is performed with respect to the epitaxial film 2 of the n type with the silicon oxide film 222 as a mask, and a trench 4 reaching the silicon substrate 1 is formed. At this time, plural trenches 4 are formed such that an interval Lt between the adjacent trenches is greater than a trench width Wt.

The trench may have a stripe pattern and a dot (square, hexagon, etc.) pattern, and it is sufficient to have a periodic property of the trench.

Figure 28C:
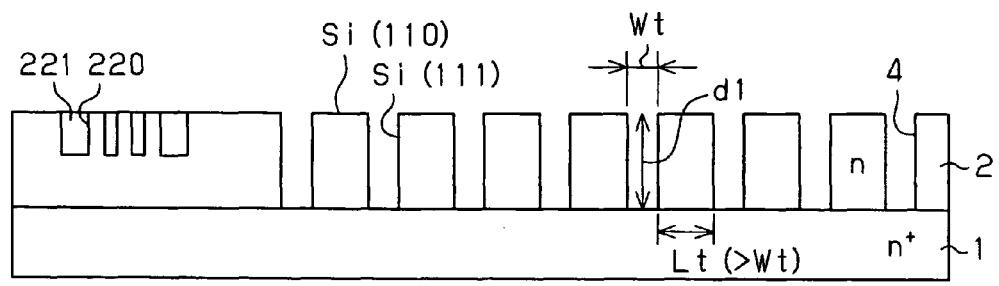
Figure 28D:
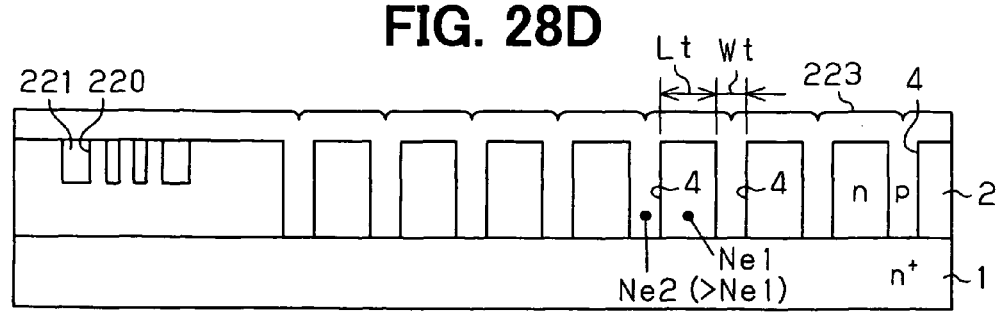

Subsequently, as shown in FIG. 28C, the silicon oxide film 222 used as a mask is removed. Further, hydrogen anneal is preferably performed after the oxide film 222 as a mask is removed. As shown in FIG. 28D, a p type epitaxial film 223 having concentration higher than the impurity concentration of the n type epitaxial film 2 is formed on this n type epitaxial film 2 including an inner face of the trench 4, and the interior of the trench 4 is filled by this epitaxial film 223. In a process for filling the interior of this trench 4 by the epitaxial film 223, a mixing gas of a silicon source gas and a halide gas is used as gas supplied to the silicon substrate so as to form the epitaxial film 223. Forward taper growth from a trench bottom portion is performed by using this mixing epitaxy. Concretely, one of monosilane ($SiH_4$), disilane ($Si_2H_6$), dichlorosilane ($SiH_2Cl_2$), trichlorosilane ($SiHCl_3$) and silicon tetrachloride ($SiCl_4$) is used as the silicon source gas. In particular, one of dichlorosilane ($SiH_2Cl_2$), trichlorosilane ($SiHCl_3$) and silicon tetrachloride ($SiCl_4$) is preferably used as the silicon source gas. One of hydrogen chloride (HCl), chlorine ($Cl_2$), fluorine ($F_2$), chlorine trifluoride ($ClF_3$), hydrogen fluoride (HF) and hydrogen bromide (HBr) is used as the halide gas.

Further, the epitaxial film 223 is formed under a reaction rate determining condition. In particular, an upper limit of film forming temperature is set to 950° C. when monosilane or disilane is used as the silicon source gas. The upper limit of the film forming temperature is set to 1100° C. when dichlorosilane is used as the silicon source gas. The upper limit of the film forming temperature is set to 1150° C. when trichlorosilane is used as the silicon source gas. The upper limit of the film forming temperature is set to 1200° C. when silicon tetrachloride is used as the silicon source gas. Further, a lower limit of the film forming temperature is set to 800° C. when a film formation vacuum degree is set to a range from normal pressure to 100 Pa. The lower limit of the film forming temperature is set to 600° C. when the film formation vacuum degree is set to a range from 100 Pa to $1\times10^{-5}$ Pa. Thus, it is experimentally confirmed that the epitaxial growth can be performed without generating a crystal defect.

Further, Ne2×Wt=Ne1×Lt is set to be satisfied as the relation of the width Wt of the trench 4, the interval Lt between the adjacent trenches, the impurity concentration Ne1 of the epitaxial film 2 of the n type, and the impurity concentration Ne2 of the epitaxial film 223 of the p type.

Figure 29A:
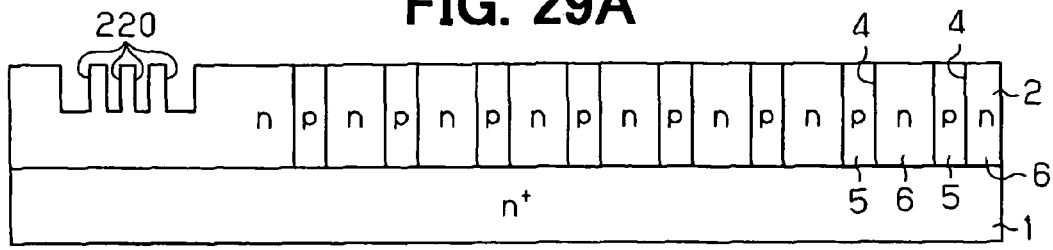
FIG. 29A to 29D are cross sectional views explaining the method for manufacturing the MOSFET shown in FIG. 26.

Thereafter, flattening and polishing are performed from the upper face side of the epitaxial film 223, and the epitaxial film (n type silicon layer) 2 is exposed as shown in FIG. 29A. Thus, the p type area 5 and the n type area 6 are alternately arranged in the transversal direction. Further, the silicon oxide film 221 (see FIG. 28D) within the trench 220 of a chip outer circumferential portion is removed.

Figure 29B:
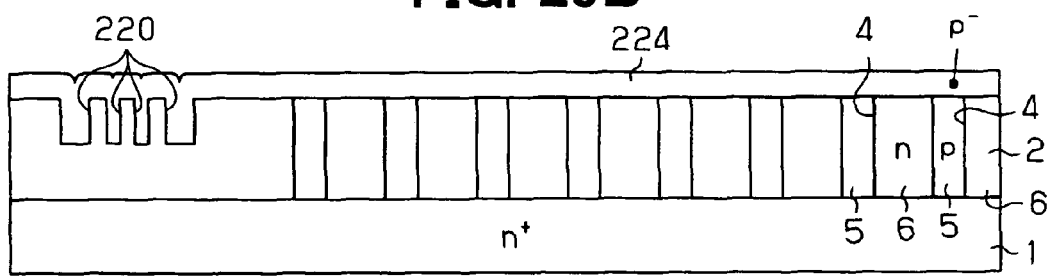
Figure 29C:
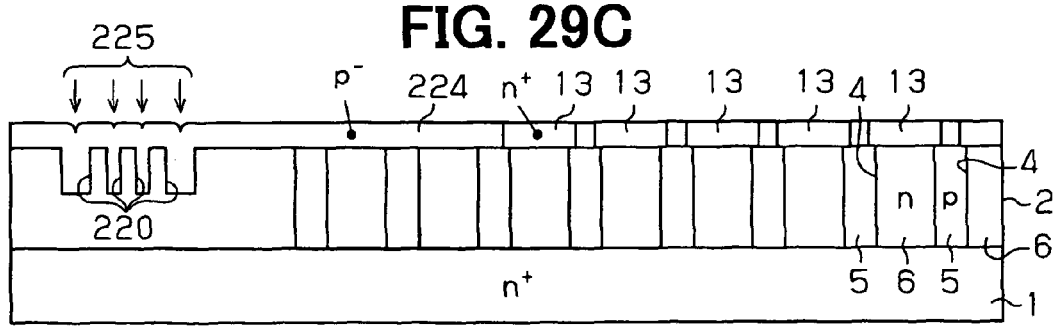

As shown in FIG. 29B, a p− type epitaxial film 224 is then formed on the epitaxial film 2. Further, as shown in FIG. 29C, an n− buffer area 13 is formed in a portion abutting on the n type area 6 in the p− type epitaxial film 224 by ion implantation. At this time, a hollow 225 is formed on an upper face of the epitaxial film 224 in the trench 220 arranged in the chip outer circumferential portion. This hollow 225 is used as an alignment mark and is aligned with a photo mask in position.

Figure 29D:
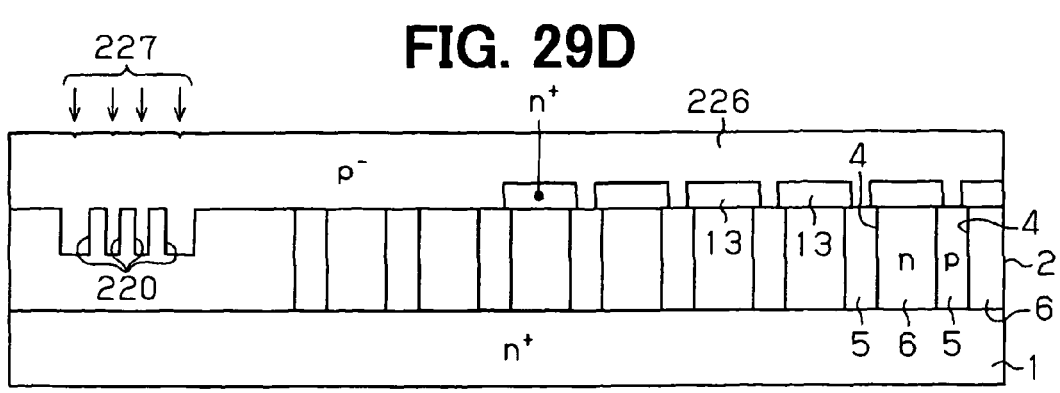

Subsequently, as shown in FIG. 29D, a p− type epitaxial film 226 is formed on the p− type epitaxial film 224.

Thereafter, as shown in FIG. 26, a LOCOS oxide film 15 is formed. Further, a p well layer 7, a trench 8, a gate oxide film 9, a polysilicon gate electrode 10, an n+ source area 11 and a p+ source contact area 12 are formed in an element section. Further, electrodes and wiring are formed. In the formation of this element section, when the n+ source area 11, the p+ source contact area 12, etc. are formed by the ion implantation, a hollow 227 is formed on an upper face of the epitaxial film 226 in the trench 220 arranged in the chip outer circumferential portion in FIG. 29D. This hollow 227 is used as an alignment mark and is aligned with a photo mask in position.

The mixing gas of the silicon source gas and the halide gas is used as gas supplied to the silicon substrates 1, 2, so as to form the epitaxial film 223 until the interior of the trench 4 is filled by the epitaxial film 223 from the beginning of the film formation of the epitaxial film 223 after the trench 4 is formed in the n type epitaxial film 2. However, in a broad sense, in a final process of at least the filling in filling the interior of the trench 4 by the epitaxial film 223, the mixing gas of the silicon source gas and the halide gas may be used as gas supplied to the silicon substrates 1, 2, so as to form the epitaxial film 223.

In such a manufacturing process, a filling epitaxial film forming process shown in FIGS. 28C and 28D will be explained in detail by using FIGS. 30A, 30B and 30C.

Figure 30A:
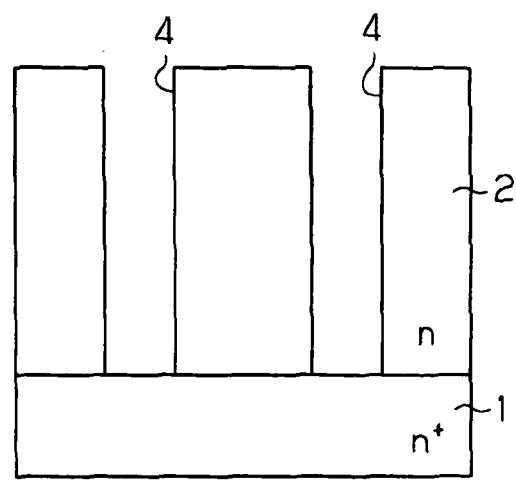
FIG. 30A to 30C are cross sectional views of a semiconductor substrate explaining the method for manufacturing the MOSFET shown in FIG. 26.
Figure 30B:
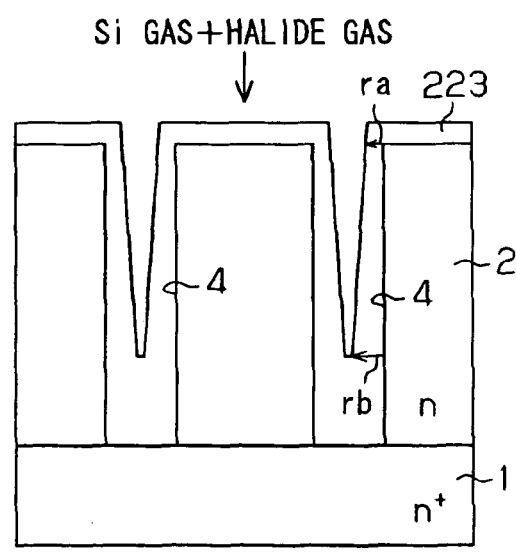
Figure 30C:
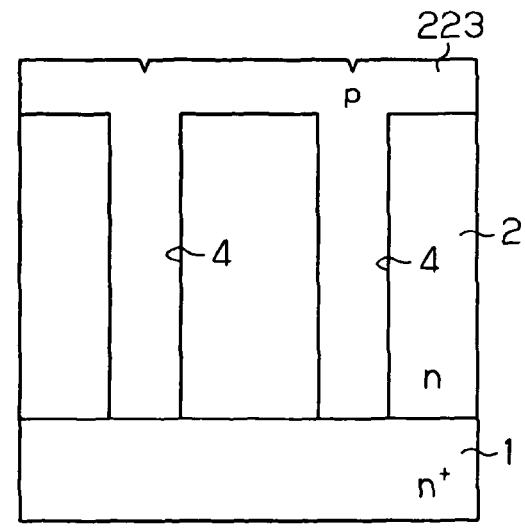

As shown in FIG. 30A, the trench 4 is formed in the epitaxial film 2 formed on the n+ silicon substrate 1. Thereafter, as shown in FIG. 30C, the interior of the trench 4 is filled by the epitaxial film 223. At this time, as shown in FIG. 30B, a growth rate in a trench opening portion is set to be slower than the growth rate in a part deeper than this trench opening portion by introducing a halide gas with respect to the epitaxial film 223 grown on a trench side face as a film forming condition of the epitaxial film 223. Namely, when the growth rate in the trench opening portion is set to ra and the growth rate in the part deeper than the trench opening portion is set to rb, ra<rb is set.

Thus, the epitaxial film formed within the trench is formed such that the film thickness of the trench opening portion becomes smaller than the film thickness of a trench bottom portion by introducing the halide gas. Thus, with respect to the epitaxial film on the trench side face, the film thickness of the trench opening portion becomes smaller than that of the trench bottom portion, and blocking in the trench opening portion due to the epitaxial film is restrained and a filling property within the trench can be improved (film formation having no void can be performed). Namely, withstand voltage at a reverse bias applying time (the source is set to a ground electric potential and the drain electric potential is set to a positive voltage) to a super junction structure (p/n column structure) can be secured and a junction leak electric current can be restrained by the voidless film formation. Further, voidless formation (a reduction of a void size), and an improvement of withstand voltage yield and an improvement of junction leak yield can be made.

In particular, when the epitaxial film 223 in FIG. 28D is formed, the following contents are set in accordance with an aspect ratio of the trench.

When the aspect ratio of the trench is less than 10 and a standard flow rate of the halide gas is set to X [slm] and the growth rate is Y [μm/minute], the following relationship is satisfied.

$$Y < 0.2X + 0.1 \tag{F4}$$

When the aspect ratio of the trench is 10 or more and is less than 20 and the standard flow rate of the halide gas is set to X [slm] and the growth rate is Y [μm/minute], the following relationship is satisfied.

$$Y < 0.2X + 0.05 \tag{F5}$$

When the aspect ratio of the trench is 20 or more and the standard flow rate of the halide gas is set to X [slm] and the growth rate is Y [μm/minute], the following relationship is satisfied.

$$Y < 0.2X \tag{F6}$$

Thus, it is preferable from the viewpoint that the trench is efficiently filled by the epitaxial film while generation of the void is restrained.

Experimental results as its basis are shown in FIGS. 10, 11 and 12. In FIGS. 10, 11 and 12, the standard flow rate X [slm] of hydrogen chloride is set on the axis of abscissa, and the growth rate Y [μm/minute] is set on the axis of ordinate. FIG. 10 shows a case in which the aspect ratio is "5". FIG. 11 shows a case in which the aspect ratio is "15". FIG. 12 shows a case in which the aspect ratio is "25". In FIGS. 10, 11 and 12, a black circle shows that there is a void, and a white circle shows that there is no void. In each of these figures, it is known that no void is generated even when the growth rate of the epitaxial film is fast if the standard flow rate of hydrogen chloride is increased. Further, it is also known that no generation of the void can be prevented if no growth rate of the epitaxial film is reduced as the aspect ratio is increased if it is the same standard flow rate of hydrogen chloride. In each of these figures, a formula showing the boundary of the existence of the generation of the void is $Y=0.2X+0.1$ in FIG. 10 and is $Y=0.2X+0.05$ in FIG. 11 and is $Y=0.2X$ in FIG. 12. No void is generated if it is an area below each formula. As shown in FIG. 28C, the aspect ratio of the trench is d1/Wt, i.e., the depth of the trench/the width of the trench.

Next, an influence of the trench width Wt will be explained by using FIGS. 31A to 33C.

Figure 31A:
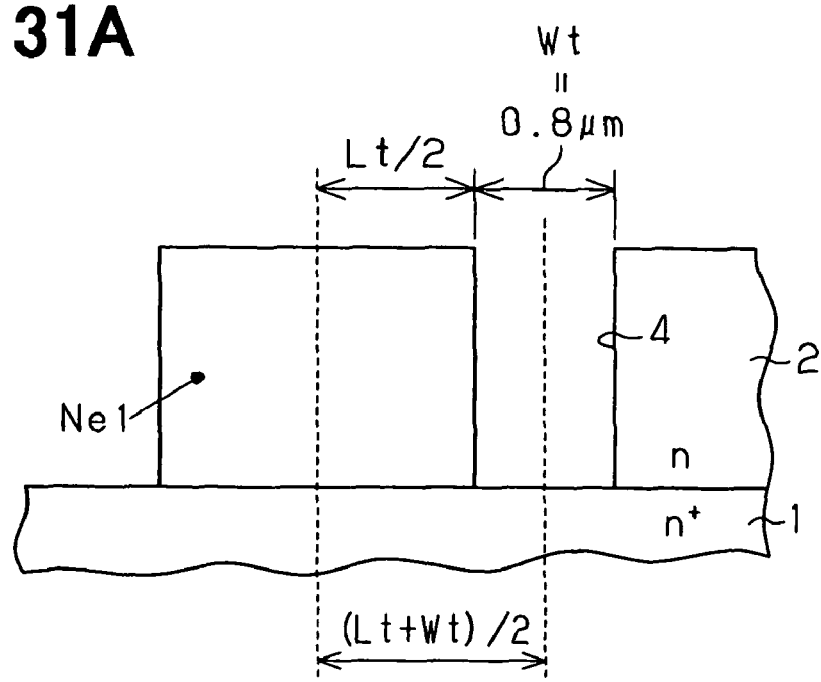
FIGS. 31A and 31B are cross sectional views showing different shapes of a trench.
Figure 31B:
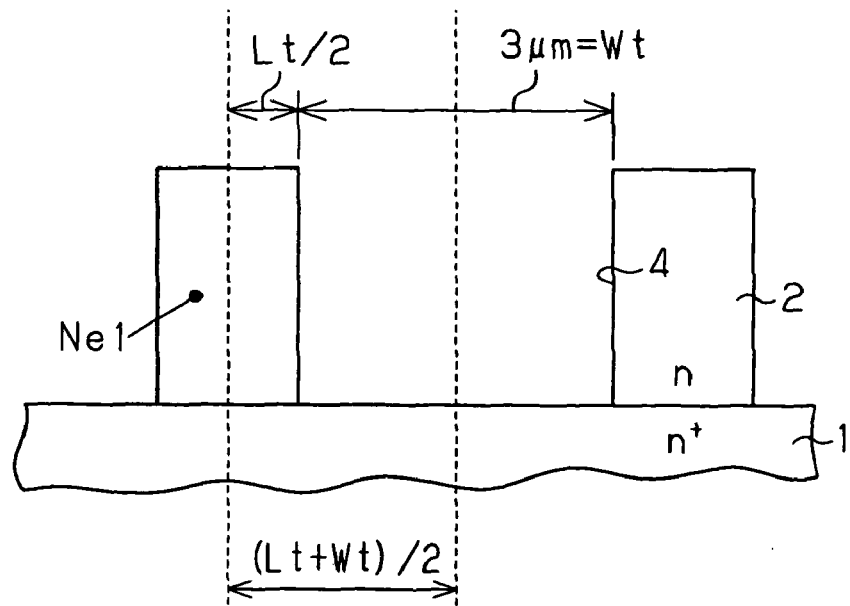

As shown in FIGS. 31A and 31B, a sample having 0.8 μm in trench width Wt and a sample having 3 μm in trench width Wt are prepared. In this case, the sum (=Wt+Lt) of the interval Lt between the trenches 4 and the trench width Wt is constant (same).

Figure 32A:
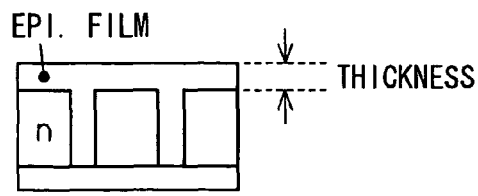
FIG. 32A is a cross sectional view showing a substrate.
Figure 32B:
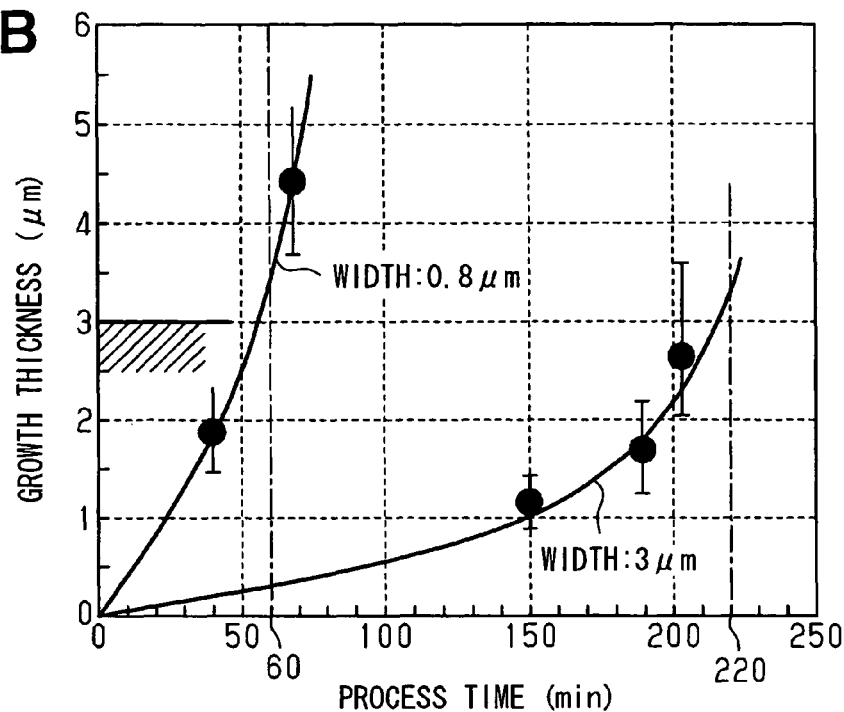
FIG. 32B is a graph showing a relationship between a process time and a growth thickness.

The epitaxial growth is then performed with respect to these two samples. Its result is shown in FIGS. 32A and 32B. In FIGS. 32A and 32B, a film forming time is set on the axis of abscissa, and a grown film thickness (exactly, a film thickness on the upper face of the substrate) is set on the axis of ordinate. In FIG. 32B, the growth thickness is measured at five points on a surface of the substrate.

In FIGS. 32A and 32B, when 3 μm is required at its minimum to secure a polishing margin with respect to the grown film thickness on the axis of ordinate, 220 minutes are required in film forming time in the sample of Wt=3 μm to satisfy this condition. In contrast to this, the film forming time may be 60 minutes in the sample of Wt=0.8 μm. Namely, the film forming time can be set to ⅓.

Figure 33A:
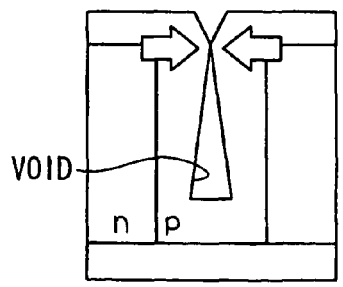
FIGS. 33A to 33C are cross sectional views showing an epitaxial film in the trench.
Figure 33B:
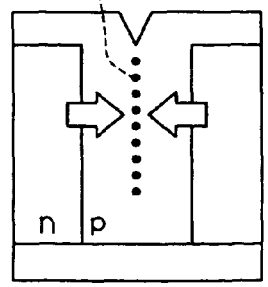
Figure 33C:
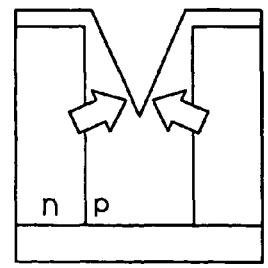

Thus, as shown in FIGS. 33A to 33C, in the relation of the flow rate of a film forming gas and the flow rate of the etching gas (halide gas) and the film forming temperature, the void is easily generated within the trench as the flow rate of the film forming gas is increased and the flow rate of the etching gas (halide gas) is reduced and the film forming temperature is raised. Here, the amount of the growth gas in FIG. 33A is the largest, and the amount of the growth gas in FIG. 33C is the smallest. The amount of the etching gas in FIG. 33A is the smallest, and the amount of the etching gas in FIG. 33C is the largest. The process temperature in FIG. 33A is the highest, and the process temperature in FIG. 33C is the lowest. Conversely, it becomes difficult to generate the void within the trench as the flow rate of the film forming gas is reduced and the flow rate of the etching gas (halide gas) is increased and the film forming temperature is lowered. In this embodiment mode, the void is restrained and the growth rate is improved in consideration of these contents. A detailed explanation will be made as follows.

As a manufacturing method of a semiconductor substrate for filling the epitaxial film within the trench and forming a diffusive layer of a high aspect ratio, particularly, as a manufacturing method of a p/n column applied to a drift layer for super junction (SJ-MOS), the growth rates of the upper face of the substrate and the trench opening portion are small in the mixing epitaxy, and the growth is made from the trench bottom portion. Therefore, as the width of the bottom portion is reduced, a growing volume per unit time is increased and filling is performed at high speed. Accordingly, as shown in FIGS. 31A and 31B, if it is the same column pitch (Wt+Lt), the super junction (SJ-MOS) forming the p/n column therein at high speed can be manufactured if the following three conditions are satisfied.

(E) The interval Lt between the adjacent trenches 4 is formed so as to be greater than the trench width Wt (Wt<Lt) as a trench structure condition.

(F) The p type epitaxial film 223 is set to be thicker than the n type epitaxial film 2 (Ne2>Ne1) in the relation of the concentration Ne1 of the n type epitaxial film 2 and the concentration Ne2 of the p type epitaxial film 223 as a filling epitaxial concentration condition.

(G) The sum (=Ne2×Wt) of the concentration Ne2 of the p type epitaxial film 223 and the trench width Wt, and the sum (=Ne1×Lt) of the concentration Ne1 of the n type epitaxial film 2 and the interval Lt between the adjacent trenches 4 are set to be equal (Ne2×Wt=Ne1×Lt) as the filling epitaxial concentration condition.

Further, with respect to a substrate face azimuth, as shown in FIG. 28C, a trench side face is set to Si (111) by using a Si (110) substrate from a bottom portion selecting property of the mixing epitaxy. Otherwise, the trench side face is set to Si (100) by using a Si (100) substrate. Thus, it becomes excellent in filling property.

In accordance with the above embodiment mode, the following effects can be obtained.

(8) As the manufacturing method of the semiconductor substrate, a first process and a second process are arranged. In the first process, plural trenches 4 are formed in the epitaxial film 2 of the n type (first electric conductivity type) formed on the silicon substrate 1 of the n type (first electric conductivity type) such that the interval Lt between the adjacent trenches 4 is greater than the trench width Wt. In the second process, the epitaxial film 223 of the p type (second electric conductivity type) having concentration higher than the impurity concentration of the epitaxial film 2 is formed on this epitaxial film 2 including the interior of the trench 4 by using the mixing gas of the silicon source gas and the halide gas as gas supplied to form the epitaxial film 223 of the p type in a final process for filling at least the trench 4. The interior of the trench 4 is then filled by the epitaxial film 223 of the p type.

Accordingly, in the final process for filling at least the trench 4, the film formation is performed by using the mixing gas of the silicon source gas and the halide gas as gas supplied to form the epitaxial film 223 of the p type. The interior of the trench 4 is then filled by the epitaxial film 223 of the p type. Thus, blocking of the trench opening portion can be restrained. On the other hand, the growth rate can be improved by forming the interval Lt between the adjacent trenches so as to be greater than the trench width Wt.

Thus, when the trench 4 is filled by the epitaxial film 223 and the semiconductor substrate is manufactured, it is possible to reconcile the restraint of the blocking of the trench opening portion and the improvement of the growth rate.

(9) In the final process for filling at least the trench 4 in filling the interior of the trench 4 by the epitaxial film 223 of the p type, the growth rate in the trench opening portion is set to be slower than the growth rate in a part deeper than this trench opening portion with respect to the epitaxial film grown on the trench side face as a film forming condition of the epitaxial film 223. Thus, the blocking in the trench opening portion due to the epitaxial film 223 is restrained and the filling property within the trench 4 can be improved.

(10) When the width of the trench 4 is set to "Wt" and the interval between the adjacent trenches 4 is set to "Lt" and the impurity concentration of the epitaxial film 2 of the n type is set to "Ne1" and the impurity concentration of the epitaxial film 223 of the p type for filling is set to "Ne2", the following relationship is satisfied.

$$Ne2 \times Wt = Ne1 \times Lt \quad (F7)$$

Accordingly, optimization can be performed in performing perfect depletion formation in the super junction structure.

(11) When the standard flow rate of the halide gas is set to X [slm] and the growth rate is set to Y [μm/minute] in forming the epitaxial film of the p type (second electric conductivity type) in the second process, the following relations are set. Namely, $Y < 0.2X + 0.1$ is set to be satisfied when the aspect ratio of the trench is less than 10. Further, $Y < 0.2X + 0.05$ is set to be satisfied when the aspect ratio of the trench is 10 or more and is less than 20. Further, $Y < 0.2X$ is set to be satisfied when the aspect ratio of the trench is 20 or more. These relations are preferable from the viewpoint that the trench is efficiently filled by the epitaxial film while the generation of a void is restrained.

In the explanations made so far, the first electric conductivity type is set to the n type, and the second electric conductivity type is set to the p type. However, conversely, the first electric conductivity type may be also set to the p type and the second electric conductivity type may be also set to the n type (concretely, the substrate 1 is set to $p^+$ and the area 5 is set to the n type and the area 6 is set to the p type in FIG. 26).

The above disclosure has the following aspects.

According to a first aspect of the present disclosure, a method for manufacturing a semiconductor device includes steps of: forming a trench on a main surface of a silicon substrate; forming a first epitaxial film on the main surface of the silicon substrate and in the trench by using a mixed gas of a silicon source gas and a halide gas so that the trench is filled with the first epitaxial film; and forming a second epitaxial film on the first epitaxial film by using another mixed gas of the silicon source gas and the halide gas. The step of forming the first epitaxial film has a first process condition with a first growth rate of the first epitaxial film growing on the main surface of the silicon substrate. The step of forming the second epitaxial film has a second process condition with a second growth rate of the second epitaxial film growing on the main surface of the silicon substrate. The second growth rate of the second epitaxial film is larger than the first growth rate of the first epitaxial film.

In the above method, since the halide gas is used for forming the first epitaxial film, the first epitaxial film in the trench has no void substantially. Further, since the second growth rate of the second epitaxial film is larger than the first growth rate of the first epitaxial film, the throughput time, i.e., the manufacturing time of the device is improved. Accordingly, a planarization of the surface of the device is simplified.

Alternatively, the method may further include a step of: polishing a surface of the second epitaxial film on the main surface of the silicon substrate after the step of forming the second epitaxial film.

Alternatively, in the step of forming the first epitaxial film, the halide gas may be flown with a first halide gas flow rate. In the step of forming the second epitaxial film, the halide gas may be flown with a second halide gas flow rate. The second halide gas flow rate is smaller than the first halide gas flow rate so that the second growth rate of the second epitaxial film is larger than the first growth rate of the first epitaxial film. Further, in the step of forming the second epitaxial film, the mixed gas may include no halide gas so that the second growth rate of the second epitaxial film is larger than the first growth rate of the first epitaxial film.

Alternatively, in the step of forming the first epitaxial film, the silicon source gas may be flown with a first silicon source gas flow rate. In the step of forming the second epitaxial film, the silicon source gas may be flown with a second silicon source gas flow rate. The second silicon source gas flow rate is larger than the first silicon source gas flow rate so that the second growth rate of the second epitaxial film is larger than the first growth rate of the first epitaxial film.

Alternatively, in the step of forming the first epitaxial film, the first process condition may include a first process temperature. In the step of forming the second epitaxial film, the second process condition may include a second process temperature. The second process temperature is higher than the first process temperature so that the second growth rate of the second epitaxial film is larger than the first growth rate of the first epitaxial film.

Alternatively, in the step of forming the first epitaxial film, the first process condition may include a first process pressure. In the step of forming the second epitaxial film, the second process condition may include a second process pressure. The second process pressure is higher than the first process pressure so that the second growth rate of the second epitaxial film is larger than the first growth rate of the first epitaxial film.

Alternatively, in the step of forming the first epitaxial film, the first epitaxial film may be formed by a low pressure CVD method, and, in the step of forming the second epitaxial film, the second epitaxial film may be formed by the low pressure CVD method. Further, in the step of forming the first epitaxial film, the first epitaxial film may be formed by a low pressure CVD method, and, in the step of forming the second epitaxial film, the second epitaxial film may be formed by an atmospheric pressure CVD method.

Alternatively, in the step of forming the second epitaxial film, the second process condition may include at least two different parameters different from the first process condition so that the second growth rate of the second epitaxial film is larger than the first growth rate of the first epitaxial film, and at least two different parameters are selected from a group consisting of a halide gas flow rate, a silicon source gas flow rate, a process temperature and a process pressure.

Alternatively, the step of forming the first epitaxial film may be continuously switched to the step of forming the second epitaxial film in such a manner that at least one parameter selected from a group consisting of a halide gas flow rate, a silicon source gas flow rate, a process temperature and a process pressure is gradually changed so that the second growth rate of the second epitaxial film is larger than the first growth rate of the first epitaxial film.

Alternatively, the method may further include a step of: monitoring a surface temperature of the first epitaxial film from a main surface side of the silicon substrate by using a pyrometer. The step of forming the first epitaxial film is switched to the step of forming the second epitaxial film when an output signal of the pyrometer at a predetermined monitoring temperature becomes substantially constant.

Alternatively, the halide gas may be a hydrogen chloride gas, a chlorine gas, a fluorine gas, a chlorine trifluoride gas, a hydrogen fluoride gas or a hydrogen bromide gas. Alternatively, the silicon source gas may be a mono-silane gas, a di-silane gas, a di-chloro-silane gas, or a tri-chloro-silane gas.

Alternatively, the trench may have a bottom and a side surface. The bottom of the trench includes a (110)-crystal surface, and the side surface of the trench includes a (111)-crystal surface. Further, the bottom of the trench may include a (100)-crystal surface, and the side surface of the trench may include a (100)-crystal surface.

Alternatively, in the step of forming the first epitaxial film, the halide gas may be flown with a standard flow rate, which defined as X in slm unit, and the first epitaxial film may be grown with a growth rate, which is defined as Y in unit of micron per minute. When the trench has an aspect ratio smaller than 10, the standard flow rate of the halide gas and the growth rate of the first epitaxial film has a relationship of: $Y<0.2X+0.1$. Further, when the trench has an aspect ratio equal to or larger than 10 and smaller than 20, the standard flow rate of the halide gas and the growth rate of the first epitaxial film may have a relationship of: $Y<0.2X+0.05$. Furthermore, when the trench has an aspect ratio equal to or larger than 20, the standard flow rate of the halide gas and the growth rate of the first epitaxial film may have a relationship of: $Y<0.2X$.

Alternatively, the silicon substrate may have a first conductive type. The trench includes a plurality of grooves in the silicon substrate. The silicon substrate between adjacent two grooves has a width, which is larger than a width of the groove. The first epitaxial film has a second conductive type, and the first epitaxial film has an impurity concentration higher than that of the silicon substrate. Further, in the step of forming the first epitaxial film, a growth rate of the first epitaxial film near an opening of the groove may be smaller than a growth rate of the first epitaxial film in the groove. Further, the width of the groove is defined as W, and the width of the silicon substrate between adjacent two grooves is defined as L. The impurity concentration of the silicon substrate is defined as N1, and the impurity concentration of the first epitaxial film is defined as N2. The width of the groove, the width of the silicon substrate, the impurity concentration of the silicon substrate and the impurity concentration of the first epitaxial film may have a relationship of: $N2 \times W = N1 \times L$.

According to a second aspect of the present disclosure, a method for manufacturing a semiconductor device includes steps of: forming a trench on a main surface of a silicon substrate; and forming an epitaxial film in the trench by using a mixed gas of a silicon source gas and a halide gas so that the trench is filled with the epitaxial film. In the step of forming the epitaxial film, the epitaxial film is not formed on the main surface of the silicon substrate, and the step of forming the epitaxial film is completed when a top surface of the epitaxial film in the trench and the main surface of the silicon substrate are on a same plane.

In the above method, since the halide gas is used for forming the epitaxial film, the epitaxial film in the trench has no void substantially. Further, a planarization of the surface of the device is simplified.

According to a third aspect of the present disclosure, a method for manufacturing a semiconductor device include steps of: forming a mask for a trench on a main surface of a silicon substrate; forming the trench on the main surface of the silicon substrate by etching the main surface of the silicon substrate through an opening of the mask; forming an epitaxial film in the trench of the silicon substrate with the mask by using a mixed gas of a silicon source gas and a halide gas so that the trench is filled with the epitaxial film; and removing the mask after the step of forming the epitaxial film. In the step of forming the epitaxial film, the epitaxial film is not formed on the mask, and the step of forming the epitaxial film is completed when a top surface of the epitaxial film in the trench and the main surface of the silicon substrate are on a same plane.

In the above method, since the halide gas is used for forming the epitaxial film, the epitaxial film in the trench has no void substantially. Further, a planarization of the surface of the device is simplified.

According to a fourth aspect of the present disclosure, a method for manufacturing a semiconductor device includes steps of: forming a mask for a trench on a main surface of a silicon substrate; forming the trench on the main surface of the silicon substrate by etching the main surface of the silicon substrate through an opening of the mask; forming an epitaxial film in the trench of the silicon substrate with the mask by using a mixed gas of a silicon source gas and a halide gas so that the trench is filled with the epitaxial film, wherein the epitaxial film is not formed on the mask, and the step of forming the epitaxial film is completed when a top surface of the epitaxial film in the trench is higher than the main surface of the silicon substrate; polishing a surface of the epitaxial film on a main surface side of the silicon substrate by using the mask as a stopper of polishing so that the main surface side of the silicon substrate is flattened; and removing the mask after the step of polishing the surface of the epitaxial film.

In the above method, since the halide gas is used for forming the epitaxial film, the epitaxial film in the trench has no void substantially. Further, a planarization of the surface of the device is simplified.

Alternatively, the method may further include a step of: oxidizing the main surface of the silicon substrate after the sep of removing the mask so that a sacrificial oxidation layer is formed on the main surface; and removing the sacrificial oxidation layer.

According to a fifth aspect of the present disclosure, a method for manufacturing a semiconductor device includes steps of: forming a mask for a trench on a main surface of a silicon substrate; forming the trench on the main surface of the silicon substrate by etching the main surface of the silicon substrate through an opening of the mask; forming an epitaxial film on the mask and in the trench by using a mixed gas of a silicon source gas and a halide gas so that the trench is filled with the epitaxial film; polishing a surface of the epitaxial film on a main surface side of the silicon substrate by using the mask as a stopper of polishing so that the main surface side of the silicon substrate is flattened; and removing the mask after the step of polishing the surface of the epitaxial film.

In the above method, since the halide gas is used for forming the epitaxial film, the epitaxial film in the trench has no void substantially. Further, a planarization of the surface of the device is simplified.

Alternatively, in the step of forming an epitaxial film, the epitaxial film on the mask may be made of single crystal. Further, in the step of forming an epitaxial film, the epitaxial film on the mask may be made of poly crystal.

According to a sixth aspect of the present disclosure, epitaxial growth equipment includes: a chamber; a chuck disposed in the chamber and fixing a silicon substrate, wherein the silicon substrate has a main surface, on which a trench is disposed; a first gas flow controller for controlling a gas flow rate of a silicon source gas, wherein the silicon source gas is to be introduced into the chamber in order to form an epitaxial film on the silicon substrate; a second gas flow controller for controlling a gas flow rate of a halide source gas, wherein the halide gas is to be introduced into the chamber; a temperature controller for controlling a process temperature in the chamber; a pressure controller for controlling a process pressure in the chamber; a pyrometer for monitoring a surface temperature of the epitaxial film on the silicon substrate in the chamber; a main controller for controlling at least one of the first gas flow controller, the second gas flow controller, the temperature controller and the pressure controller based on an output signal of the pyrometer. The main controller switches at least one of the gas flow rate of the silicon source gas, the gas flow rate of the halide source gas, the process temperature and the process pressure in order to increase a growth rate of the epitaxial film when the output signal of the pyrometer at a predetermined monitoring surface temperature becomes substantially constant.

By using the above equipment, the epitaxial film is formed in the trench with no void substantially. Further, a planarization of the surface of the device is simplified.

According to a seventh aspect of the present disclosure, a method for manufacturing a semiconductor device includes steps of: forming a first epitaxial film having a first conductive type on a silicon substrate having the first conductive type; forming a plurality of trenches in the first epitaxial film, wherein the first epitaxial film between adjacent two trenches has a width, which is larger than a width of the trench; forming a second epitaxial film having a second conductive type on the first epitaxial film and in the trench so that the trench is filled with the second epitaxial film, wherein the second epitaxial film has an impurity concentration higher than that of the first epitaxial film. The step of forming the second epitaxial film includes a final step, in which a mixed gas of a silicon source gas and a halide gas is used for forming the second epitaxial film.

In the above method, the trench opening is not covered with the second epitaxial film before the trench is filled with the second epitaxial film. Further, since the first epitaxial film between adjacent two trenches has a width larger than a width of the trench, the growth rate of the second epitaxial film is increased.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor device comprising steps of:

forming a trench on a main surface of a silicon substrate;

forming a first epitaxial film on the main surface of the silicon substrate and in the trench by using a mixed gas of a silicon source gas and a halide gas so that the trench is filled with the first epitaxial film; and forming a second epitaxial film on the first epitaxial film by using another mixed gas of the silicon source gas and the halide gas, wherein the step of forming the first epitaxial film has a first process condition with a first growth rate of the first epitaxial film growing on the main surface of the silicon substrate, wherein the step of forming the second epitaxial film has a second process condition with a second growth rate of the second epitaxial film growing on the main surface of the silicon substrate, wherein the second growth rate of the second epitaxial film is larger than the first growth rate of the first epitaxial film, wherein in the step of forming the first epitaxial film, the halide gas is flown with a standard flow rate, which defined as X in slm unit, and the first epitaxial film is grown with a growth rate, which is defined as Y in unit of micron per minute, wherein the trench has an aspect ratio larger than 10, and the standard flow rate of the halide gas and the growth rate of the first epitaxial film has a relationship of:

$Y<0.2X+0.1.$

2. The method according to claim 1, wherein in the step of forming the first epitaxial film, the silicon source gas is flown with a first silicon source gas flow rate, wherein in the step of forming the second epitaxial film, the silicon source gas is flown with a second silicon source gas flow rate, wherein in the step of forming the first epitaxial film, the first process condition includes a first process temperature, wherein in the step of forming the second epitaxial film, the second process condition includes a second process temperature, and wherein the second silicon source gas flow rate is larger than the first silicon source gas flow rate and the second process temperature is higher than the first process temperature so that the second growth rate of the second epitaxial film is larger than the first growth rate of the first epitaxial film.

3. The method according to claim 2, further comprising a step of:

polishing a surface of the second epitaxial film on the main surface of the silicon substrate after the step of forming the second epitaxial film.

4. The method according to claim 1, wherein in the step of forming the first epitaxial film, the halide gas is flown with a first halide gas flow rate, in the step of forming the second epitaxial film, the halide gas is flown with a second halide gas flow rate, and the second halide gas flow rate is smaller than the first halide gas flow rate so that the second growth rate of the second epitaxial film is larger than the first growth rate of the first epitaxial film.

5. The method according to claim 2, wherein in the step of forming the second epitaxial film, the mixed gas includes no halide gas so that the second growth rate of the second epitaxial film is larger than the first growth rate of the first epitaxial film.

6. The method according to claim 1, wherein in the step of forming the first epitaxial film, the first process condition includes a first process temperature and a first process pressure, wherein in the step of forming the second epitaxial film, the second process condition includes a second process temperature and a second process pressure, and wherein the second process temperature is higher than the first process temperature and the second process pressure is higher than the first process pressure so that the second growth rate of the second epitaxial film is larger than the first growth rate of the first epitaxial film.

7. The method according to claim 1, wherein in the step of forming the first epitaxial film, the silicon source gas is flown with a first silicon source gas flow rate, wherein in the step of forming the second epitaxial film, the silicon source gas is flown with a second silicon source gas flow rate, wherein in the step of forming the first epitaxial film, the first process condition includes a first process pressure, wherein in the step of forming the second epitaxial film, the second process condition includes a second process pressure, and wherein the second process pressure is higher than the first process pressure and the second silicon source gas flow rate is larger than the first silicon source gas flow rate so that the second growth rate of the second epitaxial film is larger than the first growth rate of the first epitaxial film.

8. The method according to claim 2, wherein in the step of forming the first epitaxial film, the first epitaxial film is formed by a low pressure CVD method, and in the step of forming the second epitaxial film, the second epitaxial film is formed by the low pressure CVD method.

9. The method according to claim 2, wherein in the step of forming the first epitaxial film, the first epitaxial film is formed by a low pressure CVD method, and in the step of forming the second epitaxial film, the second epitaxial film is formed by an atmospheric pressure CVD method.

10. The method according to claim 2, wherein the step of forming the first epitaxial film is continuously switched to the step of forming the second epitaxial film in such a manner that at least one parameter selected from a group consisting of a halide gas flow rate, a silicon source gas flow rate, a process temperature and a process pressure is gradually changed so that the second growth rate of the second epitaxial film is larger than the first growth rate of the first epitaxial film.

11. The method according to claim 2, further comprising a step of:

monitoring a surface temperature of the first epitaxial film from a main surface side of the silicon substrate by using a pyrometer, wherein the step of forming the first epitaxial film is switched to the step of forming the second epitaxial film when an output signal of the pyrometer at a predetermined monitoring temperature becomes substantially constant.

12. The method according to claim 2, wherein the halide gas is a hydrogen chloride gas, a chlorine gas, a fluorine gas, a chlorine trifluoride gas, a hydrogen fluoride gas or a hydrogen bromide gas.

13. The method according to claim 2, wherein the silicon source gas is a mono-silane gas, a di-silane gas, a di-chloro-silane gas, or a tri-chloro-silane gas.

14. The method according to claim 2, wherein the trench has a bottom and a side surface, the bottom of the trench includes a (110)-crystal surface, and the side surface of the trench includes a (111)-crystal surface.

15. The method according to claim 2, wherein the trench has a bottom and a side surface, the bottom of the trench includes a (100)-crystal surface, and the side surface of the trench includes a (100)-crystal surface.

16. The method according to claim 1, wherein the trench has an aspect ratio equal to or larger than 10 and smaller than 20, and the standard flow rate of the halide gas and the growth rate of the first epitaxial film has a relationship of:

$Y<0.2X+0.05.$

17. The method according to claim 1, wherein the trench has an aspect ratio equal to or larger than 20, and the standard flow rate of the halide gas and the growth rate of the first epitaxial film has a relationship of:

$Y<0.2X.$

18. The method according to claim 2, wherein the silicon substrate has a first conductive type, the trench includes a plurality of grooves in the silicon substrate, the silicon substrate between adjacent two grooves has a width, which is larger than a width of the grooves, the first epitaxial film has a second conductive type, and the first epitaxial film has an impurity concentration higher than that of the silicon substrate.

19. The method according to claim 18, wherein in the step of forming the first epitaxial film, a growth rate of the first epitaxial film near an opening of the grooves is smaller than a growth rate of the first epitaxial film in the grooves.

20. The method according to claim 18, wherein the width of the groove is defined as W, the width of the silicon substrate between adjacent two grooves is defined as L, the impurity concentration of the silicon substrate is defined as N1, the impurity concentration of the first epitaxial film is defined as N2, the width of the groove, the width of the silicon substrate, the impurity concentration of the silicon substrate and the impurity concentration of the first epitaxial film have a relationship of:

$N2 \times W = N1 \times L.$

* * * * *